US011905412B2

(12) United States Patent
Taki et al.

(10) Patent No.: US 11,905,412 B2
(45) Date of Patent: Feb. 20, 2024

(54) RESIN COMPOSITION, PREPREG, LAMINATE, MULTILAYER PRINTED WIRING BOARD, AND SEMICONDUCTOR PACKAGE

(71) Applicant: Showa Denko Materials Co., Ltd., Tokyo (JP)

(72) Inventors: Takahiro Taki, Tokyo (JP); Takako Ejiri, Tokyo (JP); Tetsuro Iwakura, Tokyo (JP); Kana Uchimura, Tokyo (JP); Toshiki Fujii, Tokyo (JP); Yukako Omori, Tokyo (JP); Tetsuya Kato, Tokyo (JP); Osamu Fujioka, Tokyo (JP)

(73) Assignee: RESONAC CORPORATION, Tokyo (JP)

( * ) Notice: Subject to any disclaimer, the term of this patent is extended or adjusted under 35 U.S.C. 154(b) by 93 days.

(21) Appl. No.: 17/600,463

(22) PCT Filed: Apr. 3, 2020

(86) PCT No.: PCT/JP2020/015370
§ 371 (c)(1),
(2) Date: Sep. 30, 2021

(87) PCT Pub. No.: WO2020/204175
PCT Pub. Date: Oct. 8, 2020

(65) Prior Publication Data
US 2022/0169852 A1 Jun. 2, 2022

(30) Foreign Application Priority Data
Apr. 3, 2019 (JP) .................. 2019-071594

(51) Int. Cl.
| B32B 3/10 | (2006.01) |
| C08L 79/08 | (2006.01) |
| C08J 5/24 | (2006.01) |
| B32B 5/02 | (2006.01) |
| B32B 15/14 | (2006.01) |
| B32B 15/20 | (2006.01) |
| B32B 37/18 | (2006.01) |
| C08G 73/12 | (2006.01) |
| H05K 1/03 | (2006.01) |
| H01L 23/498 | (2006.01) |
| H05K 1/02 | (2006.01) |

(52) U.S. Cl.
CPC ............ *C08L 79/085* (2013.01); *B32B 5/022* (2013.01); *B32B 15/14* (2013.01); *B32B 15/20* (2013.01); *B32B 37/18* (2013.01); *C08G 73/128* (2013.01); *C08J 5/244* (2021.05); *C08J 5/249* (2021.05); *H05K 1/0373* (2013.01); *B32B 2250/40* (2013.01); *B32B 2260/021* (2013.01); *B32B 2260/046* (2013.01); *B32B 2262/101* (2013.01); *B32B 2305/076* (2013.01); *B32B 2307/204* (2013.01); *B32B 2307/3065* (2013.01); *B32B 2307/748* (2013.01); *B32B 2311/12* (2013.01); *B32B 2315/085* (2013.01); *B32B 2457/08* (2013.01); *C08J 2379/08* (2013.01); *C08J 2425/04* (2013.01); *C08J 2471/00* (2013.01); *H01L 23/49822* (2013.01); *H05K 1/024* (2013.01); *H05K 2201/012* (2013.01)

(58) Field of Classification Search
None
See application file for complete search history.

(56) References Cited

U.S. PATENT DOCUMENTS

| 2015/0044485 A1 | 2/2015 | Wang et al. | |
| 2016/0060429 A1* | 3/2016 | Kitai | ...................... C08L 63/00 523/451 |
| 2017/0174835 A1 | 6/2017 | Hsieh et al. | |
| 2018/0127547 A1* | 5/2018 | Tanigawa | ............... C08K 5/523 |

FOREIGN PATENT DOCUMENTS

| EP | 3290479 A | 3/2018 |
| JP | 2015-086330 A | 5/2015 |
| WO | 2016/175325 A1 | 11/2016 |

* cited by examiner

*Primary Examiner* — Christopher M Polley
(74) *Attorney, Agent, or Firm* — FITCH, EVEN, TABIN & FLANNERY, LLP

(57) ABSTRACT

The present invention relates to a resin composition containing a phosphate ester-based flame retardant (A) having an aromatic hydrocarbon group containing two or more aromatic ring structures and a polyphenylene ether derivative (B) having an ethylenically unsaturated bond-containing group at both ends.

16 Claims, No Drawings

RESIN COMPOSITION, PREPREG, LAMINATE, MULTILAYER PRINTED WIRING BOARD, AND SEMICONDUCTOR PACKAGE

CROSS-REFERENCE TO RELATED APPLICATIONS

This application is a U.S. national phase application filed under 35 U.S.C. § 371 of International Application No. PCT/JP2020/015370, filed Apr. 3, 2020, designating the United States, which claims priority from Japanese Application No. 2019-071594, filed Apr. 3, 2019, which is hereby incorporated herein by reference in its entirety.

TECHNICAL FIELD

The present invention relates to a resin composition, a prepreg, a laminate, a multilayer printed wiring board, and a semiconductor package.

BACKGROUND ART

Signals used in mobile communication devices, such as a cell phone, base station apparatuses for them, network infrastructure devices, such as a server and a router, large-sized computers, and the like are being increased in the speed and capacity. In accordance with this situation, printed wiring boards mounted on these electronic devices are required to adapt to high-frequency signals, and a substrate material having excellent dielectric characteristics (low dielectric constant and low dielectric dissipation factor) in a high frequency range (for example, 10 GHz or higher) (hereinafter sometimes referred to as high-frequency properties) which enable reduction of a transmission loss is demanded. Recently as such applications that handle high-frequency signals, not only in the above-mentioned electronic devices but also in the ITS field (in connection with automobiles and traffic systems) as well as in the field of indoor short-distance communications systems, practical use planning and practical realization of novel systems that handle high-frequency wireless signals are being promoted. Accordingly in the future, low transmission-loss substrate materials are expected to be required for the printed wiring boards to be mounted on such devices.

In addition, in recent years, with increased awareness of environmental issues, it has been essential to give consideration to environment also for electronic devices and electronic components. Safety of halogen-based flame retardants which have conventionally been widely used for plastic products has been suspected since it was reported that decabromodiphenyl oxide which is the most typical brominated flame retardant produces toxic brominated dibenzodioxin and furan in incineration. Accordingly in terms of consideration to environmental issues, incorporation of a halogen-free product without a conventional brominated flame retardant which contains halogen has been advanced. Note that halogen-free means containing no halogen atoms or containing halogen atoms in a trace amount. For example, the Japan Printed Circuit Association defines a halogen-free copper-clad laminate for printed wiring board as those having contents of chlorine (Cl) and bromine (Br) of each 900 ppm or less and a total content of chlorine and bromine of 1500 ppm or less.

A phosphorus-containing flame retardant is generally used for imparting flame retardancy to a halogen-free printed wiring board material, but a large amount of a flame retardant is needed for imparting flame retardancy to a halogen-free material. Thus, the dielectric characteristics of the flame retardant are increasingly having large influence on the dielectric characteristics of the printed wiring board itself. However, a flame retardant is a material poorer in dielectric characteristics among materials constituting a printed wiring board material, and thus, the dielectric characteristics of the printed wiring board may become insufficient with increase in the addition amount. This is an obstacle to enhancement of the dielectric characteristics of printed wiring boards.

PTL 1 discloses a resin composition that has excellent dielectric characteristics and is also excellent in heat resistance and flame retardancy of a cured product, the resin composition containing a modified polyphenylene ether compound, a crosslinked curing agent, and a flame retardant, the flame retardant containing a compatible phosphorus compound which is compatible to a mixture of the modified polyphenylene ether compound and the crosslinked curing agent and a non-compatible phosphorus compound which is not compatible to the mixture.

CITATION LIST

Patent Literature

JP 2015-86330 A

SUMMARY OF INVENTION

Technical Problem

In recent years, development of a resin composition having further improved dielectric characteristics in a band of 10 GHz or higher, which can be used in the fifth-generation mobile communication system (5G) antenna in which radio waves in a frequency band higher than 6 GHz are used and in a millimeter wave radar in which radio waves in a frequency band of 30 to 300 GHz are used, has been largely desired. Specifically, the resin composition is desired to have more excellent dielectric characteristics than ever while having sufficient flame retardancy. The technique of PTL 1 is improved in flame retardancy to a certain degree, but does not sufficiently respond to the high demand for dielectric characteristics in recent years.

In view of the above situation, the present invention has an object to provide a resin composition that exhibits excellent dielectric characteristics in a high frequency band of 10 GHz or higher while having sufficient flame retardancy, and to provide a prepreg, a laminate, a multilayer printed wiring board, and a semiconductor package which are obtained by using the resin composition. The present invention also has an object to provide a combination of components contained in a resin composition which can exhibit excellent dielectric characteristics in a high frequency band of 10 GHz or higher while having sufficient flame retardancy.

Solution to Problem

As a result of intensive studies for achieving the above object, the present inventors have found that a resin composition containing a flame retardant having a special molecular structure and a polyphenylene ether derivative exhibits excellent dielectric characteristics while having sufficient flame retardancy, completing the present invention.

Specifically the present invention relates to [1] to [15] below.

[1] A resin composition containing:
a phosphate ester-based flame retardant (A) having an aromatic hydrocarbon group containing two or more aromatic ring structures; and
a polyphenylene ether derivative (B) having an ethylenically unsaturated bond-containing group at both ends.

[2] The resin composition according to the above [1], wherein the aromatic hydrocarbon group containing two or more aromatic ring structures is a divalent aromatic hydrocarbon group in which two or more aromatic rings are linked via a single bond or a linking group having 5 or less carbon atoms or a divalent fused polycyclic aromatic hydrocarbon group containing two or more aromatic ring structures.

[3] The resin composition according to the above [1] or [2], wherein the component (A) is a compound represented by the following general formula (A-1):

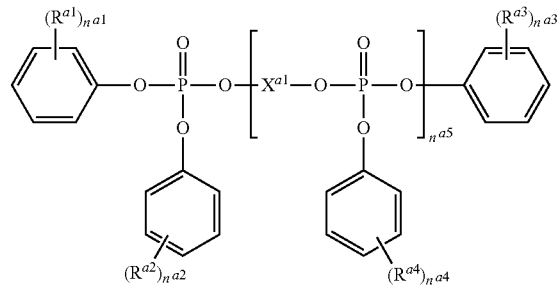

(A-1)

wherein $R^{a1}$ to $R^{a4}$ each independently represent an aliphatic hydrocarbon group having 1 to 5 carbon atoms or a halogen atom, $X^{a1}$ represents a divalent group represented by the following general formula (A-2) or a divalent fused polycyclic aromatic hydrocarbon group containing two or more aromatic ring structures, $n^{a1}$ to $n^{a4}$ each independently represent an integer of 0 to 5, and $n^{a5}$ represents an integer of 1 to 5:

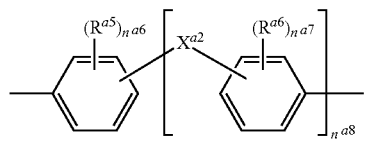

(A-2)

wherein $R^{a5}$ and $R^{a6}$ each independently represent an aliphatic hydrocarbon group having 1 to 5 carbon atoms or a halogen atom, $X^{a2}$ represents an alkylene group having 1 to 5 carbon atoms, an alkylidene group having 2 to 5 carbon atoms, an ether group, a sulfide group, a sulfonyl group, a carbonyloxy group, a keto group, or a single bond, $n^{a6}$ and $n^{a7}$ each independently represent an integer of 0 to 4, and $n^{a8}$ represents an integer of 1 to 3.

[4] The resin composition according to any one of the above [1] to [3], wherein the resin composition has a content of phosphorus atoms derived from the component (A) of 0.2 to 5% by mass based on solid components in the resin composition except for an inorganic filler.

[5] The resin composition according to any one of the above [1] to [4], wherein the ethylenically unsaturated bond-containing group of the component (B) is a (meth)acryloyl group.

[6] The resin composition according to any one of the above [1] to [5], wherein the component (B) has a weight average molecular weight (Mw) of 500 to 7,000.

[7] The resin composition according to any one of the above [1] to [6], further containing at least one thermosetting resin (C) selected from the group consisting of an epoxy resin, an isocyanate resin, and a maleimide compound.

[8] The resin composition according to the above [7], wherein the resin composition contains the maleimide compound as the component (C), the maleimide compound having a structural unit derived from a maleimide compound (c1) having at least two N-substituted maleimide groups and a structural unit derived from a diamine compound (c2).

[9] The resin composition according to the above [8], wherein the maleimide compound is a modified maleimide compound represented by the following general formula (C-2):

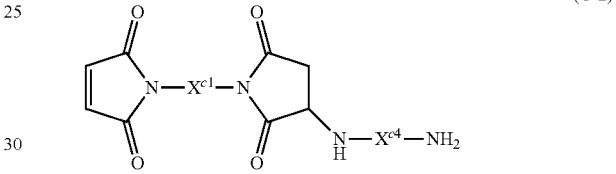

(C-2)

wherein $X^{c1}$ and $X^{c4}$ are each independently a divalent organic group.

[10] The resin composition according to any one of the above [1] to [9], further containing one or more selected from the group consisting of a styrene-based thermoplastic elastomer (D), a curing accelerator (E), and an inorganic filler (F).

[11] A prepreg including the resin composition according to any one of the above [1] to [10] and a sheet-shaped fiber-reinforced substrate.

[12] A laminate including the prepreg according to the above [11] and a metal foil.

[13] A multilayer printed wiring board including the prepreg according to the above [11] or the laminate according to the above [12].

[14] A semiconductor package including the multilayer printed wiring board according to the above [13] and a semiconductor device mounted on the multilayer printed wiring board.

[15] A method of producing a laminate, the method including a step of curing with heat the resin composition according to any one of the above [1] to [10],
the component (A) having a melting point of 50 to 250° C.,
the curing with heat being performed at a temperature of the melting point of the component (A) or higher,
the component (A) in the resin composition before curing with heat having a particle shape.

Advantageous Effects of Invention

The present invention can provide a resin composition that exhibits excellent dielectric characteristics in a high frequency band of 10 GHz or higher while having sufficient flame retardancy, and a prepreg, a laminate, a multilayer printed wiring board, and a semiconductor package which are obtained by using the resin composition.

DESCRIPTION OF EMBODIMENTS

In a numerical range described in this description, the upper limit or the lower limit of the numerical range may be substituted by values shown in Examples. In addition, the upper limit or the lower limit of a numerical range are respectively appropriately combined with the lower limit or the upper limit of another numerical range.

Unless otherwise specified, components and materials exemplified in this description may be used alone or in combination of two or more thereof. In this description, when plural substances corresponding to each component are present in a composition, the content of each component in the composition means a total amount of the plural substances present in the composition unless otherwise specified.

An aspect in which any items described in this description are appropriately combined is encompassed in the present invention.

[Resin Composition]

The resin composition of this embodiment is a resin composition containing
a phosphate ester-based flame retardant (A) having an aromatic hydrocarbon group containing two or more aromatic ring structures [hereinafter sometimes abbreviated as "phosphate ester-based flame retardant (A)" or "component (A)"] and
a polyphenylene ether derivative (B) having an ethylenically unsaturated bond-containing group at both ends [hereinafter sometimes abbreviated as "polyphenylene ether derivative (B)" or "component (B)"].

Components contained in the resin composition of this embodiment will be described below. Note that, among the components described below, there is a component that can contain halogen, but from the viewpoint of halogen free, the chlorine content and the bromine content are each preferably 900 ppm by mass or less, more preferably 500 ppm by mass or less, further preferably 100 ppm by mass or less, and particularly preferably any component contains substantially no chlorine nor bromine. In addition, from the same viewpoint, the sum of the chlorine content and bromine content is preferably 1500 ppm by mass or less, more preferably 500 ppm by mass or less, further preferably 100 ppm by mass or less, and particularly preferably any component contains substantially no chlorine nor bromine. The content of a halogen atom can be measured by ion chromatography.

Note that examples of the "halogen atom" in description below include a fluorine atom, a chlorine atom, a bromine atom, and an iodine atom.

<Phosphate Ester-Based Flame Retardant (A)>

The phosphate ester-based flame retardant (A) is a phosphate ester-based flame retardant having an aromatic hydrocarbon group containing two or more aromatic ring structures [hereinafter sometimes abbreviated as "aromatic hydrocarbon group (a)"].

By containing the phosphate ester-based flame retardant (A), the resin composition of this embodiment exhibits excellent dielectric characteristics while having sufficient flame retardancy. The reason is not clear but is inferred as follows.

The phosphate ester-based flame retardant (A) has an aromatic hydrocarbon group containing two or more aromatic ring structures in the molecule, and has a highly crystalline structure in which molecules are tightly packed due to interaction of the two or more aromatic ring structures. Thus, molecular vibration which is one of deterioration factors of dielectric characteristics is reduced.

As the phosphate ester-based flame retardant (A), one may be used alone or two or more may be used in combination.

The aromatic hydrocarbon group (a) may be a monovalent group or a di- or higher valent group, but is preferably a divalent group. When the aromatic hydrocarbon group (a) is a divalent group, the divalent aromatic hydrocarbon group (a) is preferably a divalent group that links two phosphate ester bonds (i.e., a group that forms =P(=O)—O-(aromatic hydrocarbon group (a))-O—P(=O)=).

From the viewpoints of high-frequency properties, adhesion to a conductor, and flame retardancy, the divalent aromatic hydrocarbon group (a) is preferably a divalent aromatic hydrocarbon group in which two or more aromatic rings are linked via a single bond or a linking group having 5 or less carbon atoms [hereinafter sometimes abbreviated as "aromatic hydrocarbon group (a1)"] or a divalent fused polycyclic aromatic hydrocarbon group containing two or more aromatic ring structures [hereinafter sometimes abbreviated as "aromatic hydrocarbon group (a2)"], and is more preferably the aromatic hydrocarbon group (a1).

(Aromatic Hydrocarbon Group (a1))

Examples of the two or more aromatic rings contained in the aromatic hydrocarbon group (a1) include a benzene ring, a naphthalene ring, an anthracene ring, and a phenanthrene ring. Among them, from the viewpoints of high-frequency properties, adhesion to a conductor, and flame retardancy, a benzene ring is preferred.

The aromatic hydrocarbon group formed from the aromatic rings may be or may not be substituted with a substituent. Examples of the substituent include aliphatic hydrocarbon groups having 1 to 5 carbon atoms, such as a methyl group, an ethyl group, an n-propyl group, an isopropyl group, an n-butyl group, an isobutyl group, a t-butyl group, and an n-pentyl group; and halogen atoms, such as a fluorine atom, a chlorine atom, a bromine atom, and an iodine atom.

From the viewpoints of high-frequency properties, adhesion to a conductor, and flame retardancy, the aromatic hydrocarbon group (a1) is preferably one containing a substituted or unsubstituted phenylene group, and more preferably one containing an unsubstituted phenylene group.

The two or more aromatic rings contained in the aromatic hydrocarbon group (a1) may be the same as or different from each other.

Examples of the linking group having 5 or less carbon atoms contained in the aromatic hydrocarbon group (a1) include a divalent hydrocarbon group having 1 to 5 carbon atoms, a divalent hetero atom-containing group having 5 or less carbon atoms, and a divalent group having 1 to 5 carbon atoms in which a hydrocarbon group and a hetero atom-containing group are linked. Note that the phrase "5 or less carbon atoms", as used herein, includes zero carbon atom.

Examples of the divalent hydrocarbon group having 1 to 5 carbon atoms include alkylene groups having 1 to 5 carbon atoms, such as a methylene group, a 1,2-dimethylene group, a 1,3-trimethylene group, a 1,4-tetramethylene group, and a 1,5-pentamethylene group; and alkylidene groups having 2 to 5 carbon atoms, such as an ethylidene group, a propylidene group, an isopropylidene group, a butylidene group, an isobutylidene group, a pentylidene group, and an isopentylidene group. Examples of the divalent hetero atom-containing group having 5 or less carbon atoms include an ether group, a sulfide group, a sulfonyl group, a carbonyloxy group, and a keto group.

From the viewpoints of high-frequency properties, adhesion to a conductor, and flame retardancy, the aromatic hydrocarbon group (a1) is preferably a divalent group represented by the following general formula (A-2).

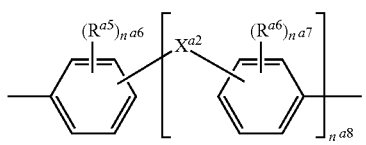

(A-2)

(In the formula, $R^{a5}$ and $R^{a6}$ each independently represent an aliphatic hydrocarbon group having 1 to 5 carbon atoms or a halogen atom. $X^{a2}$ represents an alkylene group having 1 to 5 carbon atoms, an alkylidene group having 2 to 5 carbon atoms, an ether group, a sulfide group, a sulfonyl group, a carbonyloxy group, a keto group, or a single bond. $n^{a6}$ and $n^{a7}$ each independently represent an integer of 0 to 4, and $n^{a8}$ represents an integer of 1 to 3.)

Examples of the alkylene group having 1 to 5 carbon atoms represented by $X^{a2}$ in the general formula (A-2) include a methylene group, a 1,2-dimethylene group, a 1,3-trimethylene group, a 1,4-tetramethylene group, and a 1,5-pentamethylene group.

Examples of the alkylidene group having 2 to 5 carbon atoms represented by $X^{a2}$ include an ethylidene group, a propylidene group, an isopropylidene group, a butylidene group, an isobutylidene group, a pentylidene group, and an isopentylidene group.

Among the group represented by $X^{a2}$, from the viewpoints of high-frequency properties, adhesion to a conductor, and flame retardancy, a methylene group, an isopropylidene group, and a single bond are preferred, and a single bond is more preferred.

Examples of the aliphatic hydrocarbon group having 1 to 5 carbon atoms represented by $R^{a5}$ and $R^{a6}$ in the general formula (A-2) include a methyl group, an ethyl group, an n-propyl group, an isopropyl group, an n-butyl group, an isobutyl group, a t-butyl group, and an n-pentyl group.

From the viewpoints of high-frequency properties, adhesion to a conductor, and flame retardancy, $n^{a6}$ and $n^{a7}$ in the general formula (A-2) are preferably an integer of 0 to 3, more preferably 0 or 1, and further preferably 0. When $n^{a6}$ or $n^{a7}$ is an integer of 2 or more, plural $R^{a5}$'s or plural $R^{a6}$'s may be the same as or different from one another.

$n^{a8}$ in the general formula (A-2) is preferably 1 or 2, and more preferably 1. When $n^{a8}$ is an integer of 2 or more, plural $X^{a2}$'s and plural $n^{a7}$'s may be the same as or different from one another.

From the viewpoints of high-frequency properties, adhesion to a conductor, and flame retardancy, the divalent group represented by the general formula (A-2) is preferably a divalent group represented by the following formula (A-2-1) or a divalent group represented by the following formula (A-2-2), and more preferably a divalent group represented by the following formula (A-2-2).

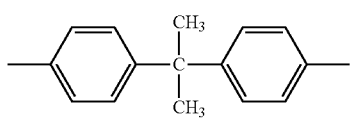

(A-2-1)

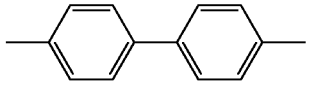

(A-2-2)

(Aromatic Hydrocarbon Group (a2))

The aromatic hydrocarbon group (a2) is a divalent fused polycyclic aromatic hydrocarbon group containing two or more aromatic ring structures. In this embodiment, the "fused polycyclic aromatic hydrocarbon" is an aromatic hydrocarbon that has two or more ring structures and has fused rings in which two or more rings share two or more atoms. Examples thereof include naphthalene, anthracene, and pyrene. Thus, an example of the aromatic hydrocarbon group (a2) is a divalent group obtained by removing two hydrogen atoms from the fused polycyclic aromatic hydrocarbon. The fused polycyclic aromatic hydrocarbon group may be or may not be substituted with a substituent. Examples of the substituent include the same examples as for the substituents that the aromatic ring contained in the aromatic hydrocarbon group (a1) may have.

The number of phosphorus atoms per molecule of the phosphate ester-based flame retardant (A) is not particularly limited, but, from the viewpoints of high-frequency properties, adhesion to a conductor, and flame retardancy, is preferably 1 to 10, more preferably 2 to 5, further preferably 2 or 3, and particularly preferably 2. When the phosphate ester-based flame retardant (A) has two or more phosphorus atoms, a fused phosphate ester in which a phosphate ester bond formed by one phosphorus atom and a phosphate ester bond formed by another phosphorus atom are linked via the divalent aromatic hydrocarbon group (a) is preferred.

The phosphate ester-based flame retardant (A) may be a monovalent phosphate ester, may be a divalent phosphate ester, or may be a trivalent phosphate ester, but from the viewpoints of high-frequency properties, adhesion to a conductor, and flame retardancy, it is preferably a trivalent phosphate ester.

The phosphate ester group of the phosphate ester-based flame retardant (A) may be any one of alkyl ester, aryl ester, aralkyl ester, and the like, but from the viewpoints of high-frequency properties, adhesion to a conductor, and flame retardancy, it is preferably aryl ester. That is, the phosphate ester-based flame retardant (A) is preferably an aromatic phosphate ester compound.

Examples of the aryl group constituting the aryl ester include a substituted or unsubstituted phenyl group and a substituted or unsubstituted naphthyl group. Examples of the substituent of the aryl group include hydrocarbon groups having 1 to 5 carbon atoms, such as a methyl group, an ethyl group, an n-propyl group, an isopropyl group, an n-butyl group, an isobutyl group, a t-butyl group, and an n-pentyl group; and halogen atoms. Among them, the aryl group is preferably an unsubstituted phenyl group or a 2,5-dimethylphenyl group.

From the viewpoints of high-frequency properties, adhesion to a conductor, and flame retardancy, the phosphate ester-based flame retardant (A) is preferably a compound represented by the following general formula (A-1).

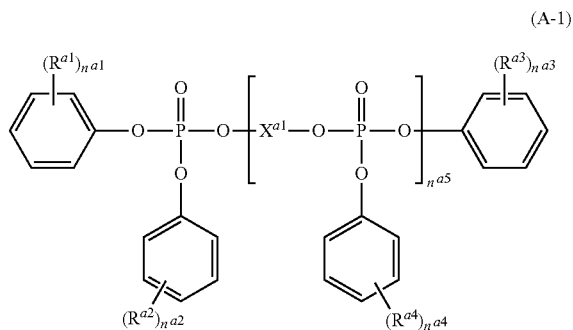

(In the formula, $R^{a1}$ to $R^{a4}$ each independently represent an aliphatic hydrocarbon group having 1 to 5 carbon atoms or a halogen atom. $X^{a1}$ represents a divalent group represented by the following general formula (A-2) or a divalent fused polycyclic aromatic hydrocarbon group containing two or more aromatic ring structures. $n^{a1}$ to $n^{a4}$ each independently represent an integer of 0 to 5, and $n^{a5}$ represents an integer of 1 to 5.)

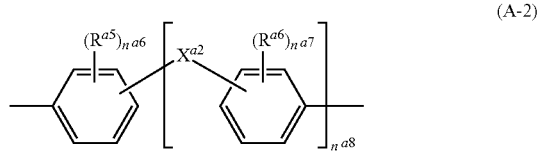

(In the formula, $R^{a5}$ and $R^{a6}$ each independently represent an aliphatic hydrocarbon group having 1 to 5 carbon atoms or a halogen atom. $X^{a2}$ represents an alkylene group having 1 to 5 carbon atoms, an alkylidene group having 2 to 5 carbon atoms, an ether group, a sulfide group, a sulfonyl group, a carbonyloxy group, a keto group, or a single bond. $n^{a6}$ and $n^{a7}$ each independently represent an integer of 0 to 4. $n^{a8}$ represents an integer of 1 to 3.)

Examples of the aliphatic hydrocarbon group having 1 to 5 carbon atoms represented by $R^{a1}$ to $R^{a4}$ in the general formula (A-1) include a methyl group, an ethyl group, an n-propyl group, an isopropyl group, an n-butyl group, an isobutyl group, a t-butyl group, and an n-pentyl group. The aliphatic hydrocarbon group is preferably an aliphatic hydrocarbon group having 1 to 3 carbon atoms, more preferably an alkyl group having 1 to 3 carbon atoms, and further preferably a methyl group.

$n^{a1}$ to $n^{a4}$ are preferably an integer of 0 to 2, and more preferably 0 or 2. When $n^{a1}$ to $n^{a4}$ are an integer of 2 or more, plural $R^{a1}$'s, $R^{a2}$'s, $R^{a3}$'s, or $R^{a4}$'s may be the same as or different from one another.

$n^{a5}$ represents an integer of 1 to 5, preferably an integer of 1 to 3, more preferably 1 or 2, and further preferably 1. When $n^{a5}$ is an integer of 2 or more, plural $X^{a1}$'s and plural $n^{a4}$'s may be the same as or different from one another.

Explanation of the aliphatic hydrocarbon groups having 1 to 5 carbon atoms represented by $R^{a5}$ and $R^{a6}$ in the general formula (A-2) is the same as the explanation of the aliphatic hydrocarbon groups having 1 to 5 carbon atoms represented by $R^{a1}$ to $R^{a4}$ in the general formula (A-1).

$n^{a6}$ and $n^{a7}$ represent an integer of 0 to 4, preferably an integer of 0 to 2, and more preferably 0. When $n^{a6}$ or $n^{a7}$ is an integer of 2 or more, plural $R^{a5}$'s or plural $R^{a6}$'s may be the same as or different from one another.

Examples of the alkylene group having 1 to 5 carbon atoms represented by $X^{a2}$ include a methylene group, a 1,2-dimethylene group, a 1,3-trimethylene group, a 1,4-tetramethylene group, and a 1,5-pentamethylene group.

Examples of the alkylidene group having 2 to 5 carbon atoms represented by $X^{a2}$ include an ethylidene group, a propylidene group, an isopropylidene group, a butylidene group, an isobutylidene group, a pentylidene group, and an isopentylidene group.

Among the groups represented by $X^{a2}$, from the viewpoints of high-frequency properties, adhesion to a conductor, and flame retardancy, a methylene group, an isopropylidene group, and a single bond are preferred, and a single bond is more preferred.

From the viewpoints of high-frequency properties, adhesion to a conductor, and flame retardancy, $X^{a2}$ is preferably a divalent group represented by the following formula (A-2-1) or a divalent group represented by the following formula (A-2-2), and more preferably a divalent group represented by the following formula (A-2-2).

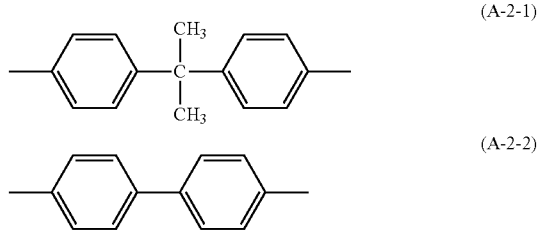

$n^{a8}$ in the general formula (A-2) represents an integer of 1 to 3, preferably 1 or 2, and more preferably 1. When $n^{a8}$ is an integer of 2 or more, plural $X^{a2}$'s and plural $n^{a7}$'s may be the same as or different from one another.

An example of the divalent fused polycyclic aromatic hydrocarbon group containing two or more aromatic ring structures represented by $X^{a1}$ in the general formula (A-1) is a divalent group obtained by removing two hydrogen atoms from a fused polycyclic aromatic hydrocarbon, such as naphthalene, anthracene, and pyrene. The fused polycyclic aromatic hydrocarbon group may be or may not be substituted with a substituent. Examples of the substituent of the fused polycyclic aromatic hydrocarbon group include aliphatic hydrocarbon groups having 1 to 5 carbon atoms, such as a methyl group, an ethyl group, an n-propyl group, an isopropyl group, an n-butyl group, an isobutyl group, a t-butyl group, and an n-pentyl group; and halogen atoms, such as a fluorine atom, a chlorine atom, a bromine atom, and an iodine atom.

Examples of the phosphate ester-based flame retardant (A) include 4,4'-biphenol-diphenyl phosphate, bisphenol A-diphenyl phosphate, 4,4'-biphenol-dicresyl phosphate, bisphenol A-dicresyl phosphate, 4,4'-biphenol-di(2,6-xylenyl phosphate), bisphenol A-di(2,6-xylenyl phosphate), 4,4'-biphenol-polyphenyl phosphate, bisphenol A-polyphenyl phosphate, 4,4'-biphenol-polycresyl phosphate, bisphenol A-polycresyl phosphate, 4,4'-biphenol-poly(2,6-xylenyl phosphate), and bisphenol A-poly(2,6-xylenyl phosphate). Among them, from the viewpoints of high-frequency properties, adhesion to a conductor, and flame retardancy, 4,4'-biphenol-di(2,6-xylenyl phosphate) is preferred.

Note that the "poly" in the above-mentioned compounds means a compound in which the number of repeating units composed of a divalent phenol compound-derived structure and a phosphoric acid-derived structure (for example, in the general formula (A-1), the structural units the number of which is represented by $n^{a5}$) constituting the phosphate ester compound is two or more. In some cases, the "poly" means that the average of the number of the repeating units exceeds 1 by containing the above compound.

The average particle size of the phosphate ester-based flame retardant (A) is not particularly limited, but is preferably 0.1 to 10 μm, more preferably 0.3 to 5 μm, further preferably 0.5 to 3 μm, and particularly preferably 0.8 to 2.5 μm. When the average particle size of the phosphate ester-based flame retardant (A) is the lower limit or more, excellent handling ability tends to be achieved. With an average particle size of the upper limit or less, dispersibility of the component (A) in the resin composition tends to be good and excellent flame retardancy tends to be achieved.

Here, the average particle size in this embodiment is a particle size of a point corresponding to a volume of 50% in a cumulative frequency distribution curve that is determined by particle sizes with the whole volume of particles taken as 100%. The average particle size can be measured by a particle size distribution measurement apparatus using a laser diffraction scattering method and the like.

The average particle size of the phosphate ester-based flame retardant (A) can be adjusted to the above range by applying a known dry or wet grinding method.

The melting point of the phosphate ester-based flame retardant (A) is not particularly limited, but is preferably 50 to 250° C., more preferably 100 to 230° C., further preferably 150 to 200° C., and particularly preferably 170 to 190° C. When the molting point of the phosphate ester-based flame retardant (A) is the lower limit or higher, excellent dielectric characteristics tend to be achieved due to high crystallinity of the component (A). With a melting point of the upper limit or lower, excellent flame retardancy tends to be achieved because the component (A) is melted in curing with heat of the resin composition to increase dispersibility.

Note that the melting point can be measured by a differential scanning calorimetry (DSC measurement) apparatus.
(Content of Component (A))

The content of phosphorus atoms derived from the phosphate ester-based flame retardant (A) in the resin composition of this embodiment is not particularly limited, but is preferably 0.2 to 5% by mass, more preferably 0.3 to 3% by mass, further preferably 0.6 to 2.5% by mass, further preferably 1.0 to 2.2% by mass, and particularly preferably 1.2 to 2.0% by mass, based on solid components in the resin composition except for an inorganic filler. When the content of the component (A) is the lower limit or more, better flame retardancy tends to be achieved while suppressing deterioration in high-frequency properties. With a content of the upper limit or less, better moldability, adhesion to a conductor, and more excellent heat resistance and high-frequency properties tend to be achieved.

Note that the "resin component" in this embodiment is defined as all the solid components constituting the resin composition except for inorganic compounds, such as an inorganic filler described later, and except for a flame retardant, such as the component (A), and a flame retardant auxiliary.

In addition, the solid components in this embodiment refer to components other than volatile substances, such as water and a solvent as described later, in the resin composition. That is, the solid components also include a component of liquid form, syrup form, or wax form at a room temperature around 25° C., and do not necessarily mean a component in a solid from.

The content of the phosphate ester-based flame retardant (A) in the resin composition of this embodiment is not particularly limited, but from the same viewpoint as above, the content is preferably 3 to 50 parts by mass, more preferably 5 to 45 parts by mass, further preferably 10 to 40 parts by mass, furthermore preferably 15 to 35 parts by mass, and particularly preferably 20 to 30 parts by mass, based on 100 parts by mass of the sum of the resin components.
<Polyphenylene Ether Derivative (B)>

The polyphenylene ether derivative (B) is a polyphenylene ether derivative having an ethylenically unsaturated bond-containing group at both ends.

Note that, in this description, the "ethylenically unsaturated bond-containing group" means a substituent containing a carbon-carbon double bond to which an addition reaction can be made and does not include a double bond in an aromatic ring.

As the polyphenylene ether derivative (B), one may be used alone or two or more may be used in combination.

Examples of the ethylenically unsaturated bond-containing group include unsaturated aliphatic hydrocarbon groups, such as a vinyl group, an allyl group, a 1-methylallyl group, an isopropenyl group, a 2-butenyl group, a 3-butehyl group, and a styryl group; and groups containing a hetero atom and an ethylenically unsaturated bond, such as a maleimide group and a group represented by the following general formula (B-1). Among them, from the viewpoints of high-frequency properties, adhesion to a conductor, and flame retardancy, a group represented by the following general formula (B-1) is preferred.

(B-1)

(In the formula, $R^{b1}$ represents a hydrogen atom or an alkyl group having 1 to 20 carbon atoms.)

The alkyl group having 1 to 20 carbon atoms represented by $R^{b1}$ may be any one of a linear alkyl group, a branched alkyl group, or a cyclic alkyl group, and is preferably a linear alkyl group.

The number of carbon atoms in the alkyl group is preferably 1 to 10, more preferably 1 to 5, further preferably 1 to 3, and particularly preferably 1.

Examples of the alkyl group include a methyl group, an ethyl group, a propyl group, a butyl group, a pentyl group, a hexyl group, a heptyl group, an octyl group, a decyl group, a pentadecyl group, a hexadecyl group, and a heptadecyl group. Among them, a methyl group is preferred.

From the viewpoints of high-frequency properties, adhesion to a conductor, and flame retardancy, the group represented by the general formula (B-1) is preferably a (meth)acryloyl group (i.e., the general formula (B-1) in which $R^{b1}$ represents a hydrogen atom or a methyl group), and more preferably a methacryloyl group. Note that the "(meth)acryloyl group" in this embodiment means an acryloyl group or a methacryloyl group.

Note that, in this description, a group that partially has an unsaturated aliphatic hydrocarbon group but is not an unsaturated aliphatic hydrocarbon group as the entire group, such as a maleimide group or a group represented by the general formula (B-1), is not included in the "unsaturated aliphatic hydrocarbon group".

The polyphenylene ether derivative (B) is preferably a group having a group represented by the general formula (B-1) at one end or at both ends thereof.

The number of ethylenically unsaturated bond-containing groups per molecule of the polyphenylene ether derivative (B) is not particularly limited, but is preferably 2 to 5, more preferably 2 to 3, and further preferably 2. When the number of ethylenically unsaturated bond-containing groups is the lower limit or more, excellent heat resistance tends to be achieved. With a number of the upper limit or less, excellent flowability and moldability tend to be achieved.

The polyphenylene ether derivative (B) simply has an ethylenically unsaturated bond-containing group at both ends, and may further have an ethylenically unsaturated bond-containing group at a position other than the two ends, but preferably has an ethylenically unsaturated bond-containing group only at both ends. The polyphenylene ether derivative (B) is preferably a polyphenylene ether having a methacryloyl group at both ends.

The polyphenylene ether derivative (B) has a phenylene ether bond, and preferably has a structural unit represented by the following general formula (B-2).

(In the formula, $R^{b2}$ represents an aliphatic hydrocarbon group having 1 to 5 carbon atoms or a halogen atom. $n^{b1}$ is an integer of 0 to 4.)

Examples of the aliphatic hydrocarbon group having 1 to 5 carbon atoms represented by $R^{b2}$ in the general formula (B-2) include a methyl group, an ethyl group, an n-propyl group, an isopropyl group, an n-butyl group, an isobutyl group, a t-butyl group, and an n-pentyl group. The aliphatic hydrocarbon group is preferably an aliphatic hydrocarbon group having 1 to 3 carbon atoms, more preferably an alkyl group having 1 to 3 carbon atoms, and further preferably a methyl group.

$n^{b1}$ represents an integer of 0 to 4, preferably 1 or 2, and more preferably 2. When $n^{b1}$ is 1 or 2, $R^{b2}$ is preferably substituted at the ortho position (based on the substitution position of the oxygen atom) on the benzene ring. When $n^{b1}$ is an integer of 2 or more, plural $R^{b2}$'s may be the same as or different from one another.

The structural unit represented by the general formula (B-2) is preferably a structural unit represented by the following general formula (B-2').

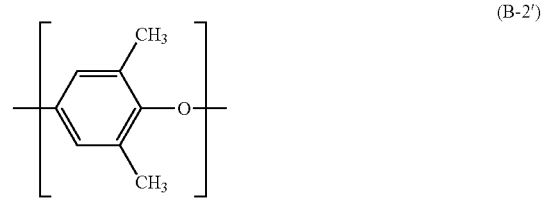

From the viewpoints of high-frequency properties, adhesion to a conductor, and flame retardancy, the polyphenylene ether derivative (B) is preferably a compound represented by the following general formula (B-3).

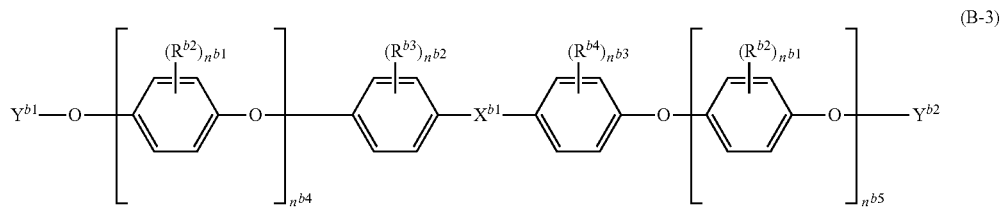

(In the formula, $R^{b2}$ and $n^{b1}$ are the same as in the explanation in the general formula (B-2). $R^{b3}$ and $R^{b4}$ each independently represent an aliphatic hydrocarbon group having 1 to 5 carbon atoms or a halogen atom. $n^{b2}$ and $n^{b3}$ each independently represent an integer of 0 to 4. $n^{b4}$ and $n^{b5}$ each independently represent an integer of 0 to 20, and the sum of $n^{b4}$ and $n^{b5}$ is an integer of 1 to 30. $X^{b1}$ represents an alkylene group having 1 to 5 carbon atoms, an alkylidene group having 2 to 5 carbon atoms, an ether group, a sulfide group, a sulfonyl group, a carbonyloxy group, a keto group, or a single bond. $Y^{b1}$ and $Y^{b2}$ each independently represent the ethylenically unsaturated bond-containing group.)

Explanation of the aliphatic hydrocarbon groups having 1 to 5 carbon atoms represented by $R^{b3}$ and $R^{b4}$ in the general formula (B-3) is the same as the explanation of the aliphatic hydrocarbon group having 1 to 5 carbon atoms represented by $R^{b2}$ in the general formula (B-2).

$n^{b2}$ and $n^{b3}$ represent an integer of 0 to 4, preferably an integer of 0 to 3, and preferably 2 or 3. When $n^{b2}$ or $n^{b3}$ is an integer of 2 or more, plural $R^{b3}$'s or plural $R^{b4}$'s may be the same as or different from one another.

$n^{b4}$ and $n^{b5}$ represent an integer of 0 to 20, preferably an integer of 1 to 20, more preferably an integer of 2 to 15, and further preferably an integer of 3 to 10. When $n^{b4}$ or $n^{b5}$ is an integer of 2 or more, plural $n^{b1}$'s may be the same as or different from one another.

The sum of $n^{b4}$ and $n^{b5}$ is an integer of 1 to 30, preferably an integer of 2 to 25, more preferably an integer of 5 to 20, and further preferably an integer of 7 to 15.

Examples of the alkylene group having 1 to 5 carbon atoms represented by $X^{b1}$ in the general formula (B-3) include a methylene group, a 1,2-dimethylene group, a 1,3-trimethylene group, a 1,4-tetramethylene group, and a 1,5-pentamethylene group.

Examples of the alkylidene group having 2 to 5 carbon atoms represented by $X^{b1}$ include an ethylidene group, a propylidene group, an isopropylidene group, a butylidene group, an isobutylidene group, a pentylidene group, and an isopentylidene group.

Among the groups represented by $X^{b1}$, from the viewpoints of high-frequency properties, adhesion to a conductor, and flame retardancy, an isopropylidene group is preferred.

Preferred aspects of the ethylenically unsaturated bond-containing group represented by $Y^{b1}$ and $Y^{b2}$ are as above.

From the viewpoints of high-frequency properties, adhesion to a conductor, and flame retardancy, the compound represented by the general formula (B-3) is preferably a compound represented by the following general formula (B-4).

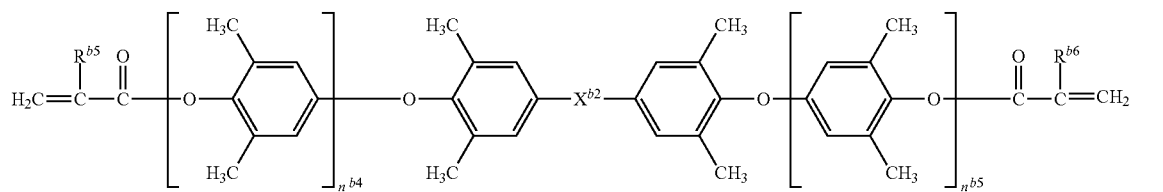

(B-4)

(In the formula, $n^{b4}$ and $n^{b5}$ are the same as the description for the general formula (B-3). $R^{b5}$ and $R^{b6}$ each independently represent a hydrogen atom or a methyl group. $X^{b2}$ represents a methylene group or an isopropylidene group.)

[Weight Average Molecular Weight (Mw) of Polyphenylene Ether Derivative (B)]

The weight average molecular weight (Mw) of the polyphenylene ether derivative (B) is not particularly limited, but is preferably 500 to 7,000, more preferably 800 to 5,000, further preferably 1,000 to 3,000, and particularly preferably 1,200 to 2,500. When the weight average molecular weight (Mw) of the component (B) is the lower limit or more, a cured product that has excellent dielectric characteristics of the polyphenylene ether and that is excellent in heat resistance tends to be obtained. With Mw of the upper limit or less, excellent moldability tends to be achieved.

In this description, a weight average molecular weight is a value calculated based on a calibration curve obtained by using polystyrene standards in gel permeation chromatography (GPC), and more specifically a value determined by a measurement method described in Examples.

The synthesis method of the polyphenylene ether derivative (B) is not particularly limited and a known synthetic method of a polyphenylene ether and a modified method thereof can be applied.

(Content of Component (B))

The content of the polyphenylene ether derivative (B) in the resin composition of this embodiment is not particularly limited, but is preferably 5 to 80 parts by mass, more preferably 6 to 45 parts by mass, further preferably 7 to 30 parts by mass, and particularly preferably 8 to 20 parts by mass, based on 100 parts by mass of the sum of the resin components. When the content of the component (B) is the lower limit or more, more excellent high-frequency properties and low hygroscopicity tend to be achieved. With a content of the upper limit or less, more excellent heat resistance, moldability, and processability tend to be achieved.

<Thermosetting Resin (C)>

The resin composition of this embodiment preferably further contains at least one thermosetting resin (C) selected from the group consisting of an epoxy resin, a cyanate resin, and a maleimide compound. Among them, from the viewpoints of high-frequency properties, adhesion to a conductor, and flame retardancy, a maleimide compound is preferably contained.

As the thermosetting resin (C), one may be used alone or two or more may be used in combination.

(Epoxy Resin)

The epoxy resin is preferably an epoxy resin having two or more epoxy groups per molecule. Epoxy resins are classified into glycidyl ether-type epoxy resins, glycidyl amine-type epoxy resins, glycidyl ester-type epoxy resins, and the like. Among them, a glycidyl ether-type epoxy resin is preferred.

Epoxy resins are also classified into various types of epoxy resins by difference in the main skeleton, and each type of the epoxy resins is further classified into bisphenol-type epoxy resins, such as a bisphenol A-type epoxy resin, a bisphenol F-type epoxy resin, and a bisphenol S-type epoxy resin; alicyclic epoxy resins; aliphatic chain epoxy resins; novolac-type epoxy resins, such as a phenol novolac-type epoxy resin, a cresol novolac-type epoxy resin, a bisphenol A novolac-type epoxy resin, a bisphenol F novolac-type epoxy resin, a phenol aralkyl novolac-type epoxy resin, and a biphenyl aralkyl novolac-type epoxy resin; stilbene-type epoxy resins; dicyclopentadiene-type epoxy resins; naphthalene skeleton-containing epoxy resins, such as a naphthol novolac-type epoxy resin and a naphthol aralkyl-type epoxy resin; biphenyl-type epoxy resins; xylylene-type epoxy resins; dihydroanthracene-type epoxy resins; and dicyclopentadiene-type epoxy resins.

When an epoxy resin is used, a curing agent, a curing auxiliary or the like for the epoxy resin may be used together, as required.

(Cyanate Resin)

Examples of the cyanate resin include 2,2-bis(4-cyanatophenyl)propane, bis(4-cyanatophenyl)ethane, bis(3,5-dimethyl-4-cyanatophenyl)methane, 2,2-bis(4-cyanatophenyl)-1,1,1,3,3,3-hexafluoropropane, α,α'-bis(4-cyanatophenyl)-m-diisopropylbenzene, a cyanate ester compound of a phenol-added dicyclopentadiene polymer, a phenol novolac-type cyanate ester compound, and a cresol novolac-type cyanate ester compound.

When a cyanate resin is used, a curing agent, a curing auxiliary or the like for the cyanate resin may be used together, as required.

(Maleimide Compound)

The maleimide compound is preferably one or more selected from the group consisting of a maleimide compound having two or more N-substituted maleimide groups [hereinafter sometimes simply abbreviated as "maleimide compound (c1)" or "component (c1)"] and a derivative thereof.

An example of the "derivative thereof" is a product of addition reaction of the maleimide compound having two or more N-substituted maleimide groups and an amine compound, such as a diamine compound.

The maleimide compound (c1) is not particularly limited as long as it is a maleimide compound having two or more N-substituted maleimide groups, but specific examples thereof include aromatic maleimide compounds, such as bis(4-maleimidephenyl)methane, polyphenylmethane maleimide, bis(4-maleimidephenyl) ether, bis(4-maleimidephenyl) sulfone, 3,3'-dimethyl-5,5'-diethyl-4,4'-diphenylmethane bismaleimide, 4-methyl-1,3-phenylene bismaleimide, m-phenylene bismaleimide, and 2,2-bis[4-(4-maleimidephenoxy)phenyl]propane; and aliphatic maleimide compounds, such as 1,6-bismaleimide-(2,2,4-trimethyl)hexane and a pyrophosphoric acid binder-type long chain alkyl bismaleimide. Among them, from the viewpoints of adhesion to a conductor and mechanical characteristics, an aromatic maleimide compound is preferred, an aromatic bismaleimide compound is more preferred, and 2,2-bis[4-(4-maleimidephenoxy)phenyl]propane and 3,3'-dimethyl-5,5'-diethyl-4,4'-diphenylmethane bismaleimide are further preferred.

The maleimide compound (c1) is preferably a compound represented by the following general formula (C1-1).

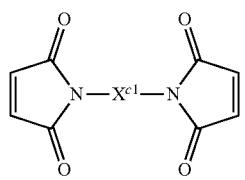

(C1-1)

(In the formula, $X^{c1}$ represents a divalent organic group.)

Examples of the divalent organic group represented by $X^{c1}$ in the general formula (C1-1) include groups represented by the following general formulae (C1-2), (C1-3), (C1-4), and (C1-5).

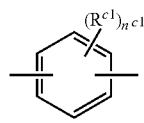

(C1-2)

(In the formula, $R^{c1}$ represents an aliphatic hydrocarbon group having 1 to 5 carbon atoms or a halogen atom, and $n^{c1}$ is an integer of 0 to 4.)

Examples of the aliphatic hydrocarbon group having 1 to 5 carbon atoms represented by $R^{c1}$ include a methyl group, an ethyl group, an n-propyl group, an isopropyl group, an n-butyl group, an isobutyl group, a t-butyl group, and an n-pentyl group. The aliphatic hydrocarbon group is preferably an aliphatic hydrocarbon group having 1 to 3 carbon atoms, and more preferably a methyl group.

$n^{c1}$ represents an integer of 0 to 4, and from the viewpoint of availability an integer of 0 to 2 is preferred, and 0 is more preferred. When $n^{c1}$ is an integer of 2 or more, plural $R_{c1}$'s may be the same as or different from one another.

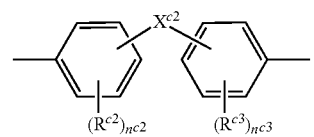

(C1-3)

(In the formula, $R^{c2}$ and $R^{c3}$ each independently represent an aliphatic hydrocarbon group having 1 to 5 carbon atoms or a halogen atom. $X^{c2}$ represents an alkylene group having 1 to 5 carbon atoms, an alkylidene group having 2 to 5 carbon atoms, an ether group, a sulfide group, a sulfonyl group, a carbonyloxy group, a keto group, a single bond, or a divalent group represented by the following general formula (C1-3-1). $n^{c2}$ and $n^{c3}$ each independently represent an integer of 0 to 4.)

Explanation of the aliphatic hydrocarbon groups having 1 to 5 carbon atoms represented by $R^{c2}$ and $R^{c3}$ is the same as the explanation of the aliphatic hydrocarbon group having 1 to 5 carbon atoms represented by $R^{c1}$ in the general formula (C1-2).

Examples of the alkylene group having 1 to 5 carbon atoms represented by $X^{c2}$ include a methylene group, a 1,2-dimethylene group, a 1,3-trimethylene group, a 1,4-tetramethylene group, and a 1,5-pentamethylene group. The alkylene group is preferably an alkylene group having 1 to 3 carbon atoms, and more preferably a methylene group.

Examples of the alkylidene group having 2 to 5 carbon atoms represented by $X^{c2}$ include an ethylidene group, a propylidene group, an isopropylidene group, a butylidene group, an isobutylidene group, a pentylidene group, and an isopentylidene group. The alkylidene group is preferably an isopropylidene group.

$n^{c2}$ and $n^{c3}$ represent an integer of 0 to 4, and from the viewpoint of availability are preferably an integer of 0 to 2, and more preferably 0 or 2. When $n^{c2}$ or $n^{c3}$ is an integer of 2 or more, plural $R^{c2}$'s or plural $R^{c3}$'s may be the same as or different from one another.

The divalent group represented by the general formula (C1-3-1) represented by $X^{c2}$ is as follows.

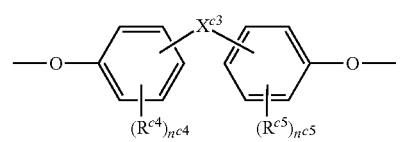

(C1-3-1)

(In the formula, $R^{c4}$ and $R^{c5}$ each independently represent an aliphatic hydrocarbon group having 1 to 5 carbon atoms or a halogen atom. $X^{c3}$ represents an alkylene group having 1 to 5 carbon atoms, an alkylidene group having 2 to 5 carbon atoms, an ether group, a sulfide group, a sulfonyl group, a carbonyloxy group, a keto group, or a single bond. $n^{c4}$ and $n^{c5}$ each independently represent an integer of 0 to 4.)

Explanation of the aliphatic hydrocarbon groups having 1 to 5 carbon atoms represented by $R^{c4}$ and $R^{c5}$ is the same as the explanation of the aliphatic hydrocarbon group having 1 to 5 carbon atoms represented by $R^{c1}$ in the general formula (C1-2).

Examples of the alkylene group having 1 to 5 carbon atoms and the alkylidene group having 2 to 5 carbon atoms represented by $X^{c3}$ include the same examples as for the alkylene group having 1 to 5 carbon atoms and the alkylidene group having 2 to 5 carbon atoms represented by $X^{c2}$ in the general formula (C1-3). Among them, from the viewpoints of high-frequency properties, adhesion to a conductor, heat resistance, glass transition temperature, thermal expansion coefficient, and flame retardancy, an isopropylidene group is preferred.

Among the groups represented by $X^{c3}$, an alkylidene group having 2 to 5 carbon atoms is preferred, and an isopropylidene group is more preferred.

$n^{c4}$ and $n^{c5}$ represent an integer of 0 to 4, and from the viewpoint of availability are preferably an integer of 0 to 2, and more preferably 0. When $n^{c4}$ or $n^{c5}$ is an integer of 2 or more, plural $R^{c4}$'s or plural $R^{c5}$'s may be the same as or different from one another.

Explanation of an aliphatic hydrocarbon groups having 1 to 5 carbon atoms represented by $R^{c6}$ and $R^{c7}$ is the same as the explanation of the aliphatic hydrocarbon group having 1 to 5 carbon atoms represented by $R^{c1}$ in the general formula (C1-2).

$n^{c7}$ represents an integer of 1 to 8, preferably an integer of 1 to 3, and more preferably 1.

When $n^{c7}$ is an integer of 2 or more, plural $R^{c6}$'s or plural $R^{c7}$'s may be the same as or different from one another.

From the viewpoint of high-frequency properties, $X^{c1}$ in the general formula (C1-1) is preferably a divalent group represented by any one of the following formulae ($X^{c1}$-1) to ($X^{c1}$-3), and more preferably a divalent group represented by the following formula ($X^{c1}$-3).

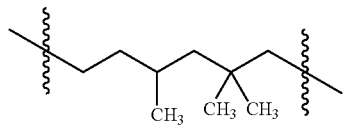

($X^{c1}$-1)

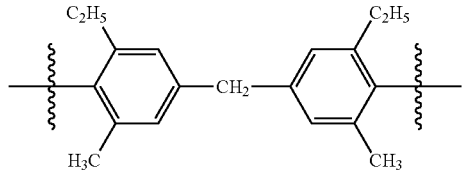

($X^{c1}$-2)

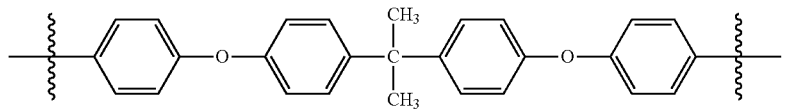

($X^{c1}$-3)

(C1-4)

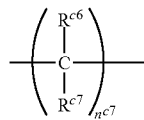

(In the formula, $n^{c6}$ represents an integer of 1 to 10.)

From the viewpoint of availability $n^{c6}$ is preferably an integer of 1 to 5, and more preferably an integer of 1 to 3.

(C1-5)

$$\left(\begin{array}{c} R^{c6} \\ | \\ -C- \\ | \\ R^{c7} \end{array}\right)_{n^{c7}}$$

(In the formula, $R^{c6}$ and $R^{c7}$ each independently represent hydrogen atom or an aliphatic hydrocarbon group having 1 to 5 carbon atoms. $n^{c7}$ represents an integer of 1 to 8.)

(The wavy line represents a binding site to the nitrogen atom in a maleimide group.)

From the viewpoints of solubility in an organic solvent, compatibility adhesion to a conductor, and high-frequency properties, the maleimide compound is preferably a derivative of the maleimide compound (c1).

The derivative of the maleimide compound (c1) is preferably a modified maleimide compound [hereinafter sometimes abbreviated as "modified maleimide compound (X)" or "component (X)"] having a structural unit derived from the maleimide compound (c1) and a structural unit derived from an amine compound having a primary amino group [hereinafter sometimes simply abbreviated as "component (c2)"].

Each of the structural unit derived from the component (c1) and the structural unit derived from the component (c2) contained in the modified maleimide compound (X) may be one structural unit or may be a combination of two or more structural units.

The modified maleimide compound (X) is preferably a compound containing a structure represented by the following formula (C-1) obtained by an addition reaction of a maleimide group of the component (c1) and a primary amino group of the component (c2).

(C-1)

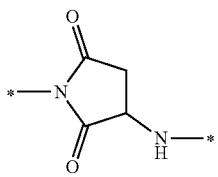

(* represents a binding site to another structure.)

Examples of the structural unit derived from the component (c1) include one or more selected from the group consisting of a group represented by the following general formula (C1-6) and a group represented by the following general formula (C1-7).

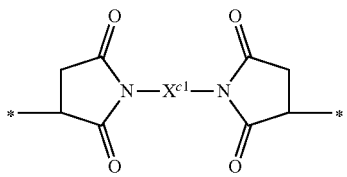
(C1-6)

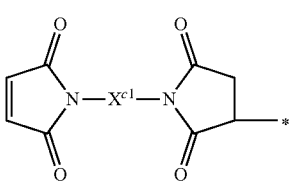
(C1-7)

(In the formula, $X^{c1}$ is the same as $X^{c1}$ in the general formula (C1-1). * represents a binding site to another structure.)

The content of the structural unit derived from the component (c1) in the modified maleimide compound (X) is not particularly limited, but is preferably 50 to 95% by mass, more preferably 70 to 92% by mass, and further preferably 85 to 90% by mass. When the content of the structural unit derived from the component (c1) is within the above range, the high-frequency properties tend to be better and a good film handling ability tends to be achieved.

The amine compound (c2) is preferably a compound having two or more amino groups, and more preferably a diamine compound having two amino groups.

Examples of the amine compound (c2) include aromatic diamine compounds, such as 4,4'-diaminodiphenylmethane, 4,4'-diamino-3,3'-dimethyldiphenylmethane, 4,4'-diamino-3,3'-diethyldiphenylmethane, 4,4'-diaminodiphenyl ether, 4,4'-diaminodiphenyl sulfone, 3,3'-diaminodiphenyl sulfone, 4,4'-diaminodiphenyl ketone, 4,4'-diaminobiphenyl, 3,3'-dimethyl-4,4'-diaminobiphenyl, 2,2'-dimethyl-4,4'-diaminobiphenyl, 3,3'-dihydroxybenzidine, 2,2-bis(3-amino-4-hydroxyphenyl)propane, 3,3'-dimethyl-5,5'-diethyl-4,4'-diaminodiphenylmethane, 2,2-bis(4-aminophenyl)propane, 2,2-bis[4-(4-aminophenoxy)phenyl]propane, 1,3-bis(3-aminophenoxy)benzene, 1,3-bis(4-aminophenoxy)benzene, 1,4-bis(4-aminophenoxy)benzene, 4,4'-bis(4-aminophenoxy)biphenyl, 1,3-bis[1-[4-(4-aminophenoxy)phenyl]-1-methylethyl]benzene, 1,4-bis[1-[4-(4-aminophenoxy)phenyl]-1-methylethyl]benzene, 4,4'-[1,3-phenylene bis(1-methylethylidene)]bisaniline, 4,4'-[1,4-phenylene bis(1-methylethylidene)]bisaniline, 3,3'-[1,3-phenylene bis(1-methylethylidene)]bisaniline, bis[4-(4-aminophenoxy)phenyl] sulfone, bis[4-(3-aminophenoxy) phenyl] sulfone, and 9,9-bis(4-aminophenyl)fluorene; and an amine-modified siloxane compound having a primary amino group.

Among them, from the viewpoint of excellent solubility in an organic solvent, reactivity with the component (c1), and heat resistance, the component (c2) is preferably 4,4'-diaminodiphenylmethane, 4,4'-diamino-3,3'-dimethyldiphenylmethane, 4,4'-diamino-3,3'-diethyldiphenylmethane, 2,2-bis[4-(4-aminophenoxy)phenyl]propane, 4,4'-[1,3-phenylene bis(1-methylethylidene)]bisaniline, and 4,4'-[1,4-phenylene bis(1-methylethylidene)]bisaniline. From the viewpoint of excellent high-frequency properties and low water absorbency 3,3'-dimethyl-5,5'-diethyl-4,4'-diaminodiphenylmethane is preferred. From the viewpoint of excellent high adhesion to a conductor, mechanical characteristics, such as elongation and breaking strength, 2,2-bis[4-(4-aminophenoxy)phenyl]propane is preferred. Furthermore, from the viewpoint of excellent solubility in an organic solvent, reactivity in synthesis, heat resistance, and high adhesion to a conductor, and in addition, from the viewpoint of excellent high-frequency properties and low hygroscopicity, 4,4'-[1,3-phenylene bis(1-methylethylidene)]bisaniline and 4,4'-[1,4-phenylene bis(1-methylethylidene)]bisaniline are preferred. From the viewpoint of low thermal expansion, an amine-modified siloxane compound is preferred.

The amine compound (c2) is preferably a compound represented by the following general formula (C2-1).

$$H_2N-X^{c4}-NH_2 \quad (C2\text{-}1)$$

(In the formula, $X^{c4}$ represents a divalent organic group.)

The component (c2) preferably contains an aromatic diamine compound in which $X^{c4}$ in the general formula (C2-1) is a divalent group represented by the following general formula (C2-2) [hereinafter sometimes abbreviated as "aromatic diamine compound (C2-2)"].

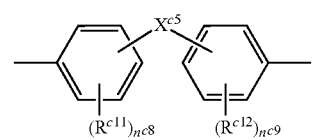
(C2-2)

(In the formula, $R^{c11}$ and $R^{c12}$ each independently represent an aliphatic hydrocarbon group having 1 to 5 carbon atoms, an alkoxy group having 1 to 5 carbon atoms, a hydroxy group, or a halogen atom. $X^{c5}$ represents an alkylene group having 1 to 5 carbon atoms, an alkylidene group having 2 to 5 carbon atoms, an ether group, a sulfide group, a sulfonyl group, a carbonyloxy group, a keto group, a fluorenylene group, a single bond, or a divalent group represented by the following general formula (C2-2-1) or (C2-2-2). $n^{c8}$ and $n^{c9}$ each independently represent an integer of 0 to 4.)

Examples of the aliphatic hydrocarbon group having 1 to 5 carbon atoms represented by $R^{c11}$ and $R^{c12}$ in the general formula (C2-2) include a methyl group, an ethyl group, an n-propyl group, an isopropyl group, an n-butyl group, an isobutyl group, a t-butyl group, and an n-pentyl group.

Examples of the alkylene group having 1 to 5 carbon atoms represented by $X^{c5}$ include a methylene group, a 1,2-dimethylene group, a 1,3-trimethylene group, a 1,4-tetramethylene group, and a 1,5-pentamethylene group.

Examples of the alkylidene group having 2 to 5 carbon atoms represented by $X^{c5}$ include an ethylidene group, a propylidene group, an isopropylidene group, a butylidene group, an isobutylidene group, a pentylidene group, and an isopentylidene group.

$n^{c8}$ and $n^{c9}$ represent an integer of 0 to 4, and from the viewpoint of availability, are preferably 0 or 1. When $n^{c8}$ or $n^{c9}$ is an integer of 2 or more, plural $R^{c11}$'s or plural $R^{c12}$'s may be the same as or different from one another.

The divalent group represented by the general formula (C2-2-1) represented by $X^{c5}$ in the general formula (C2-2) is as follows.

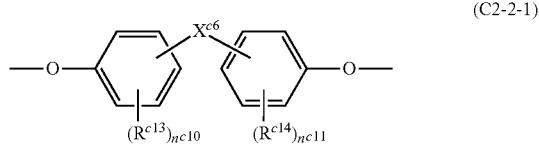

(C2-2-1)

(In the formula, $R^{c13}$ and $R^{c14}$ each independently represent an aliphatic hydrocarbon group having 1 to 5 carbon atoms or a halogen atom. $X^{c6}$ represents an alkylene group having 1 to 5 carbon atoms, an alkylidene group having 2 to 5 carbon atoms, a m-phenylene diisopropylidene group, a p-phenylene diisopropylidene group, an ether group, a sulfide group, a sulfonyl group, a carbonyloxy group, a keto group, or a single bond. $n^{c10}$ and $n^{c11}$ each independently represent an integer of 0 to 4.)

Explanation of the aliphatic hydrocarbon groups having 1 to 5 carbon atoms represented by $R^{c13}$ and $R^{c14}$ in the general formula (C2-2-1) is the same as the explanation of the aliphatic hydrocarbon groups having 1 to 5 carbon atoms represented by $R^{c11}$ and $R^{c12}$ in the general formula (C2-2).

Explanation of the alkylene group having 1 to 5 carbon atoms and the alkylidene group having 2 to 5 carbon atoms represented by $X^{c6}$ is the same as the explanation of the alkylene group having 1 to 5 carbon atoms and the alkylidene group having 2 to 5 carbon atoms represented by $X^{c5}$ in the general formula (C2-2).

$n^{c10}$ and $n^{c11}$ represent an integer of 0 to 4, and from the viewpoint of availability are preferably an integer of 0 to 2, and more preferably 0. When $n^{c10}$ or $n^{c11}$ is an integer of 2 or more, plural $R^{c13}$'s or plural $R^{c14}$'s may be the same as or different from one another.

The divalent group represented by the general formula (C2-2-2) represented by $X^{c5}$ in the general formula (C2-2) is as follows.

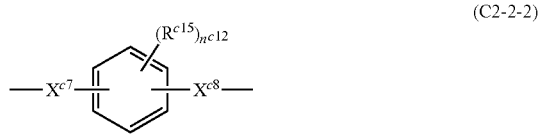

(C2-2-2)

(In the formula, $R^{c15}$ represents an aliphatic hydrocarbon group having 1 to 5 carbon atoms or a halogen atom. $X^{c7}$ and $X^{c8}$ each independently represent an alkylene group having 1 to 5 carbon atoms, an alkylidene group having 2 to 5 carbon atoms, an ether group, a sulfide group, a sulfonyl group, a carbonyloxy group, a keto group, or a single bond. $n^{c12}$ is an integer of 0 to 4.)

Explanation of the aliphatic hydrocarbon group having 1 to 5 carbon atoms represented by $R^{c15}$ in the general formula (C2-2-2) is the same as the explanation of the aliphatic hydrocarbon groups having 1 to 5 carbon atoms represented by $R^{c11}$ and $R^{c12}$ in the general formula (C2-2).

Examples of the alkylene group having 1 to 5 carbon atoms and the alkylidene group having 2 to 5 carbon atoms represented by $X^{c7}$ and $X^{c8}$ include the same examples as for the alkylene group having 1 to 5 carbon atoms and the alkylidene group having 2 to 5 carbon atoms represented by $X^{c5}$ in the general formula (C2-2). Among them, $X^{c7}$ and $X^{c8}$ are each preferably an alkylidene group having 2 to 5 carbon atoms, and more preferably an isopropylidene group.

$n^{c12}$ represents an integer of 0 to 4, and from the viewpoint of availability is preferably an integer of 0 to 2, and more preferably 0. When $n^{c12}$ is an integer of 2 or more, plural $R^{c15}$'s may be the same as or different from one another.

In addition, the component (c2) preferably contains an amine-modified siloxane compound in which $X^{c4}$ in the general formula (C2-1) is a divalent group containing a structural unit represented by the following general formula (C2-3), and more preferably contains a both-end-amine-modified siloxane compound in which $X^{c4}$ in the general formula (C2-1) is a divalent group represented by the following general formula (C2-4) [hereinafter sometimes abbreviated as "both-end-amine-modified siloxane compound (C2-4)"].

(C2-3)

(In the formula, $R^{c16}$ and $R^{c17}$ each independently represent an alkyl group having 1 to 5 carbon atoms, a phenyl group, or a substituted phenyl group.)

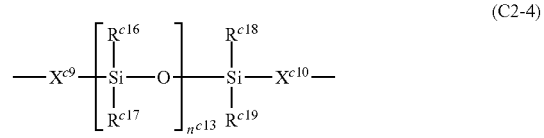

(C2-4)

(In the formula, $R^{c16}$ and $R^{c17}$ are the same as in the general formula (C2-3), and $R^{c18}$ and $R^{c19}$ each independently represent an alkyl group having 1 to 5 carbon atoms, a phenyl group, or a substituted phenyl group. $X^{c9}$ and $X^{c10}$ each independently represent a divalent organic group, and $n^{c13}$ represents an integer of 2 to 100.)

Examples of the alkyl group having 1 to 5 carbon atoms represented by $R^{c16}$ to $R^{c19}$ in the general formulae (C2-3) and (C2-4) include a methyl group, an ethyl group, an n-propyl group, an isopropyl group, an n-butyl group, an isobutyl group, a t-butyl group, and an n-pentyl group. The alkyl group is preferably an alkyl group having 1 to 3 carbon atoms, and more preferably a methyl group.

Examples of the substituent of the phenyl group in the substituted phenyl group represented by $R^{c16}$ to $R^{c19}$ include an alkyl group having 1 to 5 carbon atoms, an alkenyl group having 2 to 5 carbon atoms, and an alkynyl group having 2 to 5 carbon atoms. Examples of the alkyl group having 1 to 5 carbon atoms include a methyl group, an ethyl group, an n-propyl group, an isopropyl group, an n-butyl group, an isobutyl group, a t-butyl group, and an n-pentyl group.

Examples of the alkenyl group having 2 to 5 carbon atoms include a vinyl group and an allyl group. Examples of the alkynyl group having 2 to 5 carbon atoms include an ethynyl group and a propargyl group.

Examples of the divalent organic group represented by $X^{c9}$ and $X^{c10}$ include an alkylene group, an alkenylene group, an alkynylene group, an arylene group, —O—, or a divalent linking group in which the above groups are combined. Examples of the alkylene group include alkylene groups having 1 to 10 carbon atoms, such as a methylene group, an ethylene group, and a propylene group. An example of the alkenylene group is an alkenylene group having 2 to 10 carbon atoms. An example of the alkynylene group is an alkynylene group having 2 to 10 carbon atoms. Examples of the arylene group include arylene groups having 6 to 20 carbon atoms, such as a phenylene group and a naphthylene group.

Among them, $X^{c9}$ and $X^{c10}$ are preferably an alkylene group or an arylene group, and more preferably an alkylene group.

$n^{c13}$ represents an integer of 2 to 100, preferably an integer of 2 to 50, more preferably an integer of 3 to 40, and further preferably an integer of 5 to 30. When $n^{c13}$ is an integer of 2 or more, plural $R^{c16}$'s or plural $R^{c17}$'s may be the same as or different from one another.

The equivalent of the functional group in the amine-modified siloxane compound is not particularly limited, but is preferably 300 to 3,000 g/mol, more preferably 400 to 2,000 g/mol, and further preferably 600 to 1,000 g/mol.

As the component (c2), from the viewpoint of heat resistance and low thermal expansion, an aromatic diamine compound and an amine-modified siloxane compound are preferably used in combination, and an aromatic diamine compound (C2-2) and the both-end-amine-modified siloxane compound (C2-4) are more preferably used in combination.

The ratio of the aromatic diamine compound and the amine-modified siloxane compound used (the ratio of the contents as the structural units) [aromatic diamine compound/amine-modified siloxane compound] is not particularly limited, but is preferably 20/80 to 80/20 by mass, more preferably 40/60 to 70/30 by mass, and further preferably 50/50 to 65/35 by mass.

Examples of the structural unit derived from the component (c2) include one or more selected from the group consisting of a group represented by the following general formula (C2-5) and a group represented by the following general formula (C2-6).

(C2-5)

(C2-6)

(In the formula, $X^{c4}$ is the same as $X^{c4}$ in the general formula (C2-1), and * represents a binding site to another structure.)

The content of the structural unit derived from the component (c2) in the modified maleimide compound (X) is not particularly limited, but is preferably 5 to 50% by mass, more preferably 8 to 30% by mass, and further preferably 10 to 15% by mass. When the content of the structural unit derived from the component (c2) is in the above range, high-frequency properties tend to be excellent and better heat resistance, flame retardancy, and glass transition temperature tend to be achieved.

The total content of the structural unit derived from the component (c1) and the structural unit derived from the component (c2) in the modified maleimide compound (X) is not particularly limited, but is preferably 80% by mass or more, more preferably 90% by mass or more, further preferably 95% by mass or more, and particularly preferably 100% by mass (that is, composed only of the structural unit derived from the component (c1) and the structural unit derived from the component (c2)).

The ratio of the structural unit derived from the component (c1) and the structural unit derived from the component (c2) contained in the modified maleimide compound (X) is not particularly limited, but the equivalent ratio (Ta1/Ta2) of the total equivalent (Ta1) of the maleimide group-derived group (including maleimide group) derived from the component (c1) to the total equivalent (Ta2) of the $NH_2$ group-derived group (including —$NH_2$) in the component (c2) is preferably 0.05 to 10, and more preferably 1 to 5. With an equivalent ratio (Ta1/Ta2) in this range, high-frequency properties tend to be excellent and better heat resistance, flame retardancy, and glass transition temperature tend to be achieved.

From the viewpoint of high-frequency properties, solubility in an organic solvent, high adhesion to a conductor, and moldability. the maleimide compound preferably contains a compound represented by the following general formula (C-2).

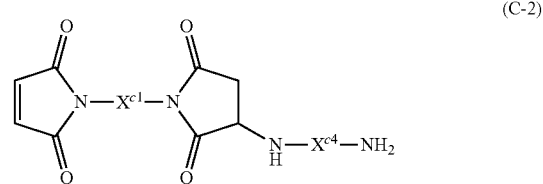

(C-2)

(In the formula, $X^{c1}$ and $X^{c4}$ are as in the explanation in the general formula (c1-1) and (c2-1).)

(Method of Producing Modified Maleimide Compound (X))

The component (X) can be obtained as a reaction product of the component (c1) and the component (c2), and, for example, can be produced by reacting the component (c1) and the component (c2) in an organic solvent.

Specifically, predetermined amounts of the component (c1), the component (c2), and, as required, another component are put in a synthetic tank to subject the component (c1) and the component (c2) to a Michael addition reaction [hereinafter sometimes abbreviated as "pre-reaction"], thereby obtaining the modified maleimide compound (X).

The reaction conditions in the pre-reaction are not particularly limited, but from the viewpoint of achieving good reactivity and workability while suppressing gelling, the reaction temperature is preferably 50 to 160° C. and the reaction time is preferably 1 to 10 hours.

In the pre-reaction, a reaction catalyst may be used as required. Examples of the reaction catalyst include an acidic catalyst, such as p-toluenesulfonic acid; amines, such as triethylamine, pyridine, and tributylamine; imidazoles, such as methylimidazole and phenylimidazole; and phosphoric catalysts, such as triphenylphosphine. One of them may be used alone or two or more thereof may be used in combination. In addition, the amount of the reaction catalyst used is not particularly limited, but is, for example, 0.01 to 5 parts by mass relative to 100 parts by mass of the total amount of the component (c1) and the component (c2).

In addition, in the pre-reaction, the concentration of the solid components as reaction materials and the viscosity of the solution may be adjusted by addition of an organic solvent or by concentration, as required. The concentration of the solid components as reaction materials is not particularly limited, but is preferably 10 to 90% by mass, and more preferably 20 to 80% by mass. When the concentration of the solid components as reaction materials is the lower limit or more, sufficient reaction rate tends to be achieved, which is advantageous in terms of the production cost, and when the concentration is the upper limit or less, better solubility tends to be achieved, stirring efficiency tends to be better, and gelling tends to be difficult.

The weight average molecular weight (Mw) of the modified maleimide compound (X) is not particularly limited, but is preferably 400 to 10,000, more preferably 1,000 to 5,000, further preferably 1,500 to 4,000, and particularly preferably 2,000 to 3,000.

(Content of Component (C))

When the resin composition of this embodiment contains the thermosetting resin (C), the content is not particularly limited, but from the viewpoints of high-frequency properties, heat resistance, and moldability, the content is preferably 10 to 95 parts by mass, more preferably 30 to 90 parts by mass, further preferably 50 to 85 parts by mass, and particularly preferably 60 to 80 parts by mass, based on 100 parts by mass of the sum of the resin components.

When the resin composition of this embodiment contains the thermosetting resin (C), the ratio of the polyphenylene ether derivative (B) to the thermosetting resin (C) contained [(B)/(C)] is not particularly limited, but is preferably 5/95 to 80/20 by mass, more preferably 6/94 to 60/40, further preferably 8/92 to 40/60, and particularly preferably 10/90 to 20/80. When the content ratio [(B)/(C)] is the lower limit or more, more excellent high-frequency properties and low hygroscopicity tend to be achieved, and when the content is the upper limit or less, more excellent heat resistance, moldability, and processability tend to be achieved.

The resin composition of this embodiment preferably further contains one or more selected from the group consisting of a styrene-based thermoplastic elastomer (D), a curing accelerator (E), and an inorganic filler (F). Next, the components will be described.

<Styrene-Based Thermoplastic Elastomer (D)>

When the resin composition of this embodiment contains a styrene-based thermoplastic elastomer (D), the balance among the high-frequency properties, moldability, adhesion to a conductor, and solder heat resistance, glass transition temperature, thermal expansion coefficient, and flame retardancy tends to be good.

As the styrene-based thermoplastic elastomer (D), one may be used alone or two or more may be used in combination.

An example of the styrene-based thermoplastic elastomer (D) is a thermoplastic elastomer having a structural unit derived from a styrene-based compound represented by the following general formula (D-1), and is preferably a thermoplastic elastomer having a styrene-derived structural unit (that is, a structural unit represented by the following general formula (D-1) in which $R^{d1}$ is a hydrogen atom and $n^{d1}$ is 0).

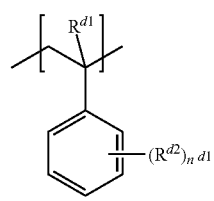

(D-1)

(In the formula, $R^{d1}$ represents a hydrogen atom or an alkyl group having 1 to 5 carbon atoms, and $R^{d2}$ represents an alkyl group having 1 to 5 carbon atoms. $n^{d1}$ represents an integer of 0 to 5.)

Examples of the alkyl group having 1 to 5 carbon atoms represented by $R^{d1}$ include a methyl group, an ethyl group, an n-propyl group, an isopropyl group, an n-butyl group, an isobutyl group, a t-butyl group, and an n-pentyl group.

Among the groups represented by $R^{d1}$, a hydrogen atom is preferred.

Examples of the alkyl group having 1 to 5 carbon atoms represented by $R^{d2}$ include a methyl group, an ethyl group, an n-propyl group, an isopropyl group, an n-butyl group, an isobutyl group, a t-butyl group, and an n-pentyl group, and the alkyl group is preferably an alkyl group having 1 to 3 carbon atoms and more preferably a methyl group.

$n^{d1}$ represents an integer of 0 to 5, preferably an integer of 0 to 2, and more preferably 0.

When $n^{d1}$ is an integer of 2 or more, plural $R^{d2}$'s may be the same as or different from one another.

Examples of a structural unit other than the styrene-based compound-derived structural unit in the styrene-based thermoplastic elastomer (D) include a butadiene-derived structural unit, an isoprene-derived structural unit, a maleic acid-derived structural unit, and a maleic anhydride-derived structural unit.

The butadiene-derived structural unit and the isoprene-derived structural unit are preferably hydrogenated. When hydrogenated, the butadiene-derived structural unit becomes a structural unit in which an ethylene unit and a butylene unit are mixed, and the isoprene-derived structural unit becomes a structural unit in which an ethylene unit and a propylene unit are mixed.

Examples of the styrene-based thermoplastic elastomer (D) include a hydrogenated styrene-butadiene-styrene block copolymer (SBS) and a hydrogenated styrene-isoprene-styrene block copolymer (SIS). Among them, from the viewpoints of high-frequency properties, adhesion to a conductor, heat resistance, glass transition temperature, and thermal expansion coefficient, a hydrogenated styrene-butadiene-styrene block copolymer (SBS) is preferred.

Examples of the hydrogenated styrene-butadiene-styrene block copolymer (SBS) include a styrene-ethylene-butylene-styrene copolymer (SEBS) obtained by completely hydrogenating the carbon-carbon double bonds in the butadiene block and a styrene-butadiene-butylene-styrene (SBBS) obtained by partially hydrogenating the carbon-carbon double bond of the 1,2-binding site in the butadiene block. Note that complete hydrogenation in SEBS is generally hydrogenation of 90% or more, and may be 95% or more, may be 99% or more, and may be substantially 100%, based on all the carbon-carbon double bonds. The rate of the partial hydrogenation in SBBS is, for example, 60 to 85% based on all the carbon-carbon double bonds.

In SEBS, the content of the styrene-derived structural unit [hereinafter sometimes abbreviated as "styrene content"] is not particularly limited, but from the viewpoints of high-frequency properties, adhesion to a conductor, heat resistance, glass transition temperature, and thermal expansion coefficient, is preferably 5 to 80% by mass, more preferably 10 to 70% by mass, further preferably 15 to 60% by mass, and particularly preferably 20 to 50% by mass.

The melt flow rate (MFR) of SEBS is not particularly limited, but is preferably 0.1 to 20 g/10 min, more preferably 1 to 15 g/10 min, further preferably 2 to 10 g/10 min, and particularly preferably 3 to 7 g/10 min, under measurement conditions of 230° C. and a load of 2.16 kgf (21.2 N).

In SBBS, the styrene content is not particularly limited, but from the viewpoints of high-frequency properties, adhesion to a conductor, heat resistance, glass transition temperature, and thermal expansion coefficient, is preferably 40 to 80% by mass, more preferably 50 to 75% by mass, and further preferably 55 to 75% by mass.

MFR of SBBS is not particularly limited, but is preferably 0.1 to 10 g/10 min, more preferably 0.5 to 8 g/10 min, and further preferably 1 to 6 g/10 min, under measurement conditions of 190° C. and a load of 2.16 kgf (21.2 N).

The styrene-based thermoplastic elastomer (D) may be modified with an acid, such as maleic anhydride. The acid value of the styrene-based thermoplastic elastomer (D) modified with an acid is not particularly limited, but is preferably 2 to 20 mg $CH_3ONa/g$, more preferably 5 to 15 mg $CH_3ONa/g$, and further preferably 7 to 13 mg $CH_3ONa/g$.

(Content of Component (D))

When the resin composition of this embodiment contains the styrene-based thermoplastic elastomer (D), the content thereof is not particularly limited, but is preferably 2 to 60 parts by mass, more preferably 6 to 40 parts by mass, further preferably 10 to 30 parts by mass, and particularly preferably 12 to 20 parts by mass, relative to 100 parts by mass of the sum of the resin components. When the content of the styrene-based thermoplastic elastomer (D) is the lower limit or more, more excellent high-frequency properties and hygroscopicity resistance tend to be achieved, and when the content is the upper limit or less, good heat resistance, moldability, processability, and flame retardancy tend to be achieved.

<Curing Accelerator (E)>

When the resin composition of this embodiment contains the curing accelerator (E), the curability tends to be enhanced and more excellent high-frequency properties, heat resistance, adhesion to a conductor, elastic modulus, and glass transition temperature tend to be achieved.

When the resin composition of this embodiment contains the curing accelerator (E), the curing accelerator (E) may be appropriately suitably selected according to the type of the thermosetting resin component (C) used.

As the curing accelerator (E), one may be used alone or two ore more may be used in combination.

Examples of the component (E) include an amine-based curing accelerator, an imidazole-based curing accelerator, a phosphorus-based curing accelerator, an organic metal salt, an acidic catalyst, and an organic peroxide. In this embodiment, imidazole-based curing accelerators are not categorized into amine-based curing accelerator.

Examples of the amine-based curing accelerator include amine compounds having a primary to tertiary amine, such as triethylamine, pyridine, tributylamine, and dicyandiamide; and a quaternary ammonium compound.

Examples of the imidazole-based curing accelerator include imidazole compounds, such as methylimidazole, phenylimidazole, 2-undecylimidazole, and isocyanate-masked imidazole (for example, a product of addition reaction of a hexamethylene diisocyanate resin and 2-ethyl-4-methylimidazole).

Examples of the phosphorus-based curing accelerator include a tertiary phosphine, such as triphenylphosphine; and a quaternary phosphonium compound, such as a product of addition reaction pf p-benzoquinone to tri-n-butylphosphine.

Examples of the organic metal salt include carboxylic acid salts of manganese, cobalt, zinc, and the like.

An example of the acidic catalyst is p-toluene sulfonate.

Examples of the organic peroxide include dicumyl peroxide, 2,5-dimethyl-2,5-bis(t-butylperoxy)hexyne-3,2,5-dimethyl-2,5-bis(t-butylperoxy)hexane, t-butylperoxyisopropyl monocarbonate, and α,α'-di(t-butylperoxy)diisopropylbenzene.

Among them, from the viewpoint of more excellent high-frequency properties, heat resistance, adhesion to a conductor, elastic modulus, and glass transition temperature, an amine-based curing accelerator, an imidazole-based curing accelerator, and a phosphorus-based curing accelerator are preferred, dicyandiamide, an imidazole-based curing accelerator, and a quaternary phosphonium compound are more preferred, and a combination thereof is further preferred. In this case, an organic peroxide may be used together, but from the viewpoint of physical properties of a cured product, no organic peroxide is preferably contained.

(Content of Component (E))

When the resin composition of this embodiment contains the curing accelerator (E), the content thereof is not particularly limited, but is preferably 0.01 to 10 parts by mass, more preferably 0.05 to 5 parts by mass, further preferably 0.1 to 3 parts by mass, and particularly preferably 0.5 to 2 parts by mass, relative to 100 parts by mass of the thermosetting resin (C). With a content of the curing accelerator (E) in the above range, better high-frequency properties, heat resistance, storage stability and moldability tend to be achieved.

<Inorganic Filler (F)>

When the resin composition of this embodiment contains the inorganic filler (F), more excellent low thermal expansion, high elastic modulus, heat resistance, and flame retardancy tend to be achieved.

As the inorganic filler (F), one may be used alone or two or more may be used in combination.

Examples of the inorganic filler (F) include silica, alumina, titanium oxide, mica, beryllia, barium titanate, potassium titanate, strontium titanate, calcium titanate, aluminum carbonate, magnesium hydroxide, aluminum hydroxide, aluminum silicate, calcium carbonate, calcium silicate, magnesium silicate, silicon nitride, boron nitride, clay (calcined clay and the like), talc, aluminum borate, and silicon carbide. Among them, from the viewpoints of thermal expansion coefficient, elastic modulus, heat resistance, and flame retardancy, silica, alumina, mica, and talc are preferred, silica and alumina are more preferred, and silica is further preferred. Examples of the silica include a precipitated silica which is produced by a wet method and has a high water content, and a dry silica which is produced by a dry method and contains little bound water and the like. Examples of the dry silica include crushed silica, fumed silica, and molten silica (molten spherical silica) depending on the production method. Among them, molten spherical silica is preferred.

The average particle size of the inorganic filler (F) is not particularly limited, but is preferably 0.01 to 20 μm, more preferably 0.1 to 10 μm, further preferably 0.2 to 1 μm, and particularly preferably 0.3 to 0.8 μm.

When the resin composition of this embodiment contains the inorganic filler (F), the content thereof is not particularly limited, but from the viewpoint of thermal expansion coefficient, elastic modulus, heat resistance, and flame retardancy, is preferably 10 to 250 parts by mass, more preferably 50 to 200 parts by mass, further preferably 80 to 180 parts by mass, furthermore preferably 100 to 160 parts by mass, and particularly preferably 120 to 150 parts by mass, relative to 100 parts by mass of the sum of the resin components.

When the inorganic filler (F) is used, for the purpose of enhancing the dispersibility of the inorganic filler (F) and adhesion of the inorganic filler (F) to an organic component in the resin composition, a coupling agent may be used together, as required. Examples of the coupling agent include a silane coupling agent and a titanate coupling agent. As the coupling agent, one may be used alone or two or more may be used in combination.

When a coupling agent is used, the treatment method may be a so-called integral blend treatment method in which the inorganic filler (F) is blended in the resin composition and then, the coupling agent is added, but is preferably a method in which an inorganic filler previously surface-treated with a coupling agent by a dry or wet method is used. By using this method, the characteristics of the inorganic filler (F) can be more effectively exhibited.

As required, the inorganic filler (F) may be used in the form of a slurry in which the inorganic filler (F) is previously dispersed in an organic solvent.

<Another Flame Retardant, Flame Retardant Auxiliary Organic Solvent>

The resin composition of this embodiment may contain, as required, one or more selected from the group consisting of a flame retardant other than the component (A) (hereinafter sometimes referred to as "another flame retardant"), a flame retardant auxiliary and an organic solvent, to the extent that the effect of the present invention is not impaired. As each of the components, one may be used alone or two or more may be used in combination. In addition, the resin composition of this embodiment may contain none of the components.

(Another Flame Retardant)

Examples of another flame retardant include an inorganic phosphorus-based flame retardant; an organic phosphorus-based flame retardant (excluding the component (A)); and metal hydrates, such as aluminum hydroxide hydrate and magnesium hydroxide hydrate. Note that a metal hydroxide may belong to inorganic filler, but is herein categorized into flame retardant when it is a material that can impart flame retardancy.

Examples of the inorganic phosphorus-based flame retardant include red phosphorus; ammonium phosphates, such as monoammonium phosphate, diammonium phosphate, triammonium phosphate, and ammonium polyphosphate; an inorganic nitrogen-containing phosphorus compound, such as phosphoric amide; phosphoric acid; and phosphine oxide.

Examples of the organic phosphorus-based flame retardant include an aromatic phosphate ester other than the component (A), a monosubstituted phosphonic acid diester, and a disubstituted phosphinic acid ester; a disubstituted phosphinic acid metal salt, an organic nitrogen-containing phosphorus compound, and a cyclic organic phosphorus compound. Here, examples of the "metal salt" include a lithium salt, a sodium salt, a potassium salt, a calcium salt, a magnesium salt, an aluminum salt, a titanium salt, and a zinc salt.

An example of the aromatic phosphate ester other than the component (A) is an aromatic phosphate ester represented by the following general formula (G-1). An example of the disubstituted phosphinic acid metal salt is a disubstituted phosphine acid metal salt represented by the following general formula (G-2).

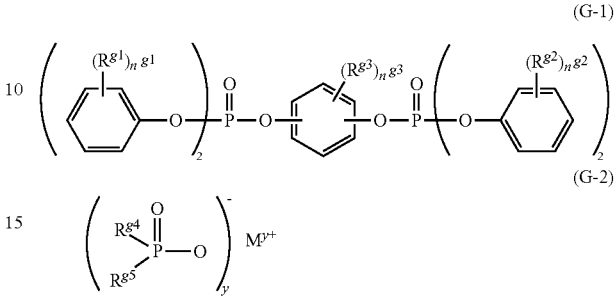

(In the formulae, $R^{g1}$ to $R^{g3}$ each independently represent an aliphatic hydrocarbon group having 1 to 5 carbon atoms or a halogen atom. $n^{g1}$ and $n^{g2}$ each independently represent an integer of 0 to 5, and $n^{g3}$ is an integer of 0 to 4. $R^{g4}$ and $R^{g5}$ each independently represent an aliphatic hydrocarbon group having 1 to 5 carbon atoms or an aromatic hydrocarbon group having 6 to 14 carbon atoms. M represents a lithium atom, a sodium atom, a potassium atom, a calcium atom, a magnesium atom, an aluminum atom, a titanium atom, or a zinc atom. y represents an integer of 1 to 4.)

Examples of the aliphatic hydrocarbon group having 1 to 5 carbon atoms represented by $R^{g1}$ to $R^{g3}$ in the general formula (G-1) include a methyl group, an ethyl group, an n-propyl group, an isopropyl group, an n-butyl group, an isobutyl group, a t-butyl group, and an n-pentyl group.

When $n^{g1}$ to $n^{g3}$ are an integer of 2 or more, plural $R^{g1}$'s, $R^{g2}$'s or $R^{g3}$'s may be the same as or different from one another.

Examples of the aliphatic hydrocarbon group having 1 to 5 carbon atoms represented by $R^{g4}$ and $R^{g5}$ in the general formula (G-2) include a methyl group, an ethyl group, an n-propyl group, an isopropyl group, an n-butyl group, an isobutyl group, a t-butyl group, and an n-pentyl group.

Examples of the aromatic hydrocarbon group having 6 to 14 carbon atoms represented by $R^{g4}$ and $R^{g5}$ include a phenyl group, a naphthyl group, a biphenyl group, and an anthryl group.

y represents the valency of the metal ion, that is, y varies in the range of 1 to 4 depending on the type of M. When y is an integer of 2 or more, plural $R^{g4}$'s or plural $R^{g5}$'s may be the same as or different from one another.

When the resin composition of this embodiment contains another flame retardant, the content thereof is not particularly limited, but is, for example, 0.1 parts by mass or more, may be 50 parts by mass or less, may be 30 parts by mass or less, may be 15 parts by mass or less, may be 5 parts by mass or less, or may be 1 part by mass or less, relative to 100 parts by mass of the component (A).

(Flame Retardant Auxiliary)

Examples of the flame retardant auxiliary include inorganic flame retardant auxiliaries, such as antimony trioxide and zinc molybdate.

When the resin composition of this embodiment contains a flame retardant auxiliary, the content thereof is not particularly limited, but is preferably 0.1 to 20 parts by mass, and more preferably 0.1 to 10 parts by mass, relative to 100 parts by mass of the sum of the resin components. When the content of the flame retardant auxiliary is within the above range, better chemical resistance tends to be achieved.
(Organic Solvent)

From the viewpoint of easy handling ability and from the viewpoint of easy production of a prepreg as described later, the resin composition of this embodiment may be a vanish resin composition containing an organic solvent.

Examples of the organic solvent include alcohol-based solvents, such as ethanol, propanol, butanol, methyl cellosolve, butyl cellosolve, and propylene glycol monomethyl ether; ketone-based solvents, such as acetone, methyl ethyl ketone, methyl isobutyl ketone, and cyclohexanone; an ether-based solvent, such as tetrahydrofuran; aromatic solvents, such as toluene, xylene, and mesitylene; nitrogen atom-containing solvents, such as dimethyl formamide, dimethyl acetamide, and N-methylpyrrolidone; a sulfur atom-containing solvent, such as dimethyl sulfoxide; and an ester-based solvent, such as γ-butyrolactone. One of the organic solvents may be used alone or two or more thereof may be used in combination.

When the resin composition of this embodiment contains an organic solvent, the content thereof is not particularly limited, but the solid component concentration in the resin composition of this embodiment is preferably 30 to 90% by mass, more preferably 40 to 80% by mass, and further preferably 50 to 70% by mass. When the content of the organic solvent is in the above range, the resin composition is easy to handle, and the impregnation of the substrate therewith and the appearance of a prepreg produced are good. Furthermore, the solid component concentration in a resin in a prepreg as described later tends to be easily adjusted, and a prepreg having a desired thickness tends to be easily produced.

<Other Components>

Furthermore, the resin composition of this embodiment may contain, as required, one or more selected from the group consisting of a resin material other than the above components, a coupling agent, an antioxidant, a thermal stabilizer, an antistatic agent, a UV absorbent, a pigment, a colorant, and a lubricant [hereinafter sometimes abbreviated as "other components"] to the extent that the effect of the present invention is not imparted. As each component, one may be used alone or two or more may be used in combination. The resin composition of this embodiment may contain none of the components.

When the resin composition of this embodiment contains the other components, the content of each component is not particularly limited, but is, for example, 0.01 parts by mass or more, may be 10 parts by mass or less, may be 5 parts by mass or less, and 1 part by mass or less, relative to 100 parts by mass of the sum of the resin components.

In addition, the total content of the component (B), the component (C), the component (D), and the component (E) in the resin components contained in the resin composition of this embodiment is not particularly limited, but is preferably 80 parts by mass or more, more preferably 90 parts by mass or more, and further preferably 95 parts by mass or more, relative to 100 parts by mass of the sum of the resin components.

<Dielectric Characteristics>

The dielectric constant (Dk) at 10 GHz as determined using the resin composition of this embodiment as a test piece by a method described in Examples described later is not particularly limited, but is preferably 4.5 or less, more preferably 4.3 or less, and further preferably 4.1 or less. A lower dielectric constant (Dk) is more preferred. The lower limit is not particularly limited, but in view of the balance with other physical properties, may be, for example, 2.5 or more, or may be 3.0 or more.

The dielectric dissipation factor (Df) at 10 GHz as determined using the resin composition of this embodiment as a test piece by a method described in Examples described later is not particularly limited, but is preferably 0.0075 or less, more preferably 0.0072 or less, further preferably 0.0070 or less, furthermore preferably 0.0068 or less, and particularly preferably 0.0066 or less. A lower dielectric dissipation factor (Df) is more preferred. The lower limit is not particularly limited, but in view of the balance with other physical properties, may be, for example, 0.0030 or more, may be 0.0040 or more, or may be 0.0050 or more.

Note that the dielectric constant (Dk) and the dielectric dissipation factor (Df) are values according to a cavity resonator perturbation method, and more specifically are values measured by a method described in Examples. In this description, a simple dielectric constant means a relative permittivity.

The resin composition of this embodiment can be produced by mixing the component (A), the component (B), and, as required, optional components to be used together by a known method. Here, each component may be dissolved or dispersed in an organic solvent as mentioned above with stirring. Conditions, such as order of mixing, temperature, time, and the like are not particularly limited and can be appropriately set.

[Prepreg]

The prepreg of this embodiment includes the resin composition of this embodiment and a sheet-shaped fiber-reinforced substrate.

The prepreg can be formed using the resin composition of this embodiment and a sheet-shaped fiber-reinforced substrate. For example, the sheet-shaped fiber-reinforced substrate is impregnated or coated with the resin composition of this embodiment, which is then dried with heat in a drying furnace at a temperature of 80 to 200° C. for 1 to 30 minutes to semi-cure (convert into B-stage) the resin composition, thereby producing a prepreg.

The content of the resin composition-derived solid component in the prepreg of this embodiment is not particularly limited, but is preferably 30 to 90% by mass, more preferably 35 to 80% by mass, further preferably 40 to 70% by mass, and particularly preferably 45 to 60% by mass. With a solid component concentration within the above range, better moldability tends to be achieved when formed into a laminate.

As the sheet-shaped fiber-reinforced substrate of the prepreg, a known substrate used in various laminates for electrical insulating materials is used. Examples of the material for the sheet-shaped fiber-reinforced substrate include inorganic fibers, such as E-glass, D-glass, S-glass, and Q-glass; organic fibers, such as polyimide, polyester, and tetrafluoroethylene; and a mixture thereof. The sheet-shaped fiber-reinforced substrate has a shape of, for example, woven fabric, nonwoven fabric, roving, chopped strand mat, surfacing mat, or the like. In addition, the thickness of the sheet-shaped fiber-reinforced substrate is not particularly limited, and, for example, a substrate of 0.02 to 0.5 mm can be used. In addition, from the viewpoint of impregnation ability with the resin composition, and from the viewpoints of heat resistance, hygroscopicity resistance, and processability when formed into a laminate, a substrate surface-treated with a coupling agent or the like and a substrate mechanically treated for fiber opening can be used.

As a method for impregnating or coating the sheet-shaped fiber-reinforced substrate with the resin composition, a hot-melt method or solvent method as described below can be used.

A hotmelt method may be a method in which without incorporation of an organic solvent into the resin composition, (1) a paper for coating that is easily releasable from the resin composition is once coated with the resin composition, and the coated paper is laminated with the sheet-shaped fiber-reinforced substrate, or (2) the sheet-shaped fiber-reinforced substrate is directly coated with the resin composition by a die coater.

On the other hand, a solvent method is a method in which an organic solvent is incorporated in the resin composition, and the sheet-shaped fiber-reinforced substrate is immersed in the resulting resin composition to impregnate the sheet-shaped fiber-reinforced substrate with the resin composition, and then is dried.

[Laminate]

The laminate of this embodiment is a laminate including the prepreg of this embodiment and a metal foil.

The laminate of this embodiment can be obtained by placing a metal foil on one face or both faces of one prepreg of this embodiment or placing a metal foil on one face or both faces of a stack of two or more prepregs of this embodiment, and then molding the resultant with heat and pressure. The laminate including a metal foil is sometimes referred to as a metal-clad laminate.

The metal for the metal foil is not particularly limited as long as it is used as an electrical insulating material, but from the viewpoint of conductivity may be copper, gold, silver, nickel, platinum, molybdenum, ruthenium, aluminum, tungsten, iron, titanium, chromium, or an alloy containing one or more of these metal elements. Copper and aluminum are preferred, and copper is more preferred.

[Method of Producing Laminate]

The method of producing a laminate of this embodiment is a method of producing a laminate, the method including a step of curing the resin composition of this embodiment with heat, the melting point of the phosphate ester-based flame retardant (A) being 50 to 250° C., the temperature for curing with heat being the melting point of the component (A) or higher, the component (A) in the resin composition before curing with heat having a particle shape.

According to the method of producing a laminate of this embodiment, the component (A) which has high crystallinity is molten in the resin composition and diffuses therein, thus highly achieving both of excellent dielectric characteristics and flame retardancy in particular.

A suitable range of the melting point of the phosphate ester-based flame retardant (A) is as described above.

The temperature for curing with heat may be any temperature that is the melting point of the component (A) or higher, but from the viewpoint of productivity is, for example, 185° C. or higher, and may be 200 to 300° C., or may be 220 to 250° C. With a temperature for curing with heat within the above range, in addition to excellent dielectric characteristics and flame retardancy good productivity tends to be achieved.

The pressure and time in curing with heat are not particularly limited, but, for example, the pressure is 0.2 to 10 MPa and the time is in the range of 0.1 to 5 hours. In addition, for the molding with heat and pressure, a method in which a vacuum press or the like is used to keep a vacuum state for 0.5 to 5 hours may be used.

[Multilayer Printed Wiring Board]

The multilayer printed wiring board of this embodiment includes the prepreg of this embodiment or the laminate of this embodiment. The multilayer printed wiring board of this embodiment can be produced, using the prepreg or laminate of this embodiment, through a circuit formation process by drilling, metal plating, metal foil etching, and the like and a multilayer adhesion process, by known methods.

[Semiconductor Package]

The semiconductor package of this embodiment include the multilayer printed wiring board of this embodiment and semiconductor devices mounted on the multilayer printed wiring board.

The semiconductor package of this embodiment can be produced, for example, by mounting semiconductor devices, such as a semiconductor chip and a memory on predetermined positions on the multilayer printed wiring board of this embodiment by a known method, and sealing the semiconductor devices with a sealing resin or the like.

Suitable embodiments of the present invention are described hereinabove, but these are exemplification for explaining the present invention and it is not intended to limit the scope of the present invention to these embodiments. The present invention can be implemented in various aspects different from the embodiments without departing from the gist of the present invention.

EXAMPLES

The present invention will be specifically described below with reference to examples. However, the present invention is not to be limited to the following examples.

Note that, in each example, the weight average molecular weight (Mw) is measured by the following method.

The weight average molecular weight (Mw) was calculated based on a calibration curve obtained using polystyrene standards by gel permeation chromatography (GPC). The calibration curve was obtained using polystyrene standards: TSK standard POLYSTYRENE (Type; A-2500, A-5000, F-1, F-2, F-4, F-10, F-20, F-40) [manufactured by TOSOH CORPORATION, trade names] with a cubic approximation. The measurement conditions of GPC are shown below.

Apparatus:
  Pump: model L-6200 [manufactured by Hitachi High-Tech Corporation]
  Detector: model L-3300 RI [manufactured by Hitachi High-Technologies Corporation]
  Column oven: L-655A-52 [manufactured by Hitachi High-Technologies Corporation]
  Column: guard column; TSK Guard column HHR-L+ column; TSKgel G4000HHR+TSKgel G2000HHR (all manufactured by TOSOH CORPORATION, tradenames)
  Column size: 6.0×40 mm (guard column), 7.8×300 mm (column)
  Eluent: tetrahydrofuran
  Sample concentration: 30 mg/5 mL
  Injection: 20 μL
  Flow rate: 1.00 mL/minute
  Measurement temperature: 40° C.

Production Example 1: Production of Modified Maleimide Compound (X-1)

Into a reactor of a 5 L volume which was equipped with a thermometer, a stirrer, and a water quantitative apparatus with a reflux condenser and was able to be heated and cooled, 100 parts by mass of 2,2-bis[4-(4-maleimide phenoxy)phenyl]propane, 5.6 parts by mass of a siloxane compound having an amino group at both ends (functional group equivalent: 750 g/mol), 7.9 parts by mass of 3,3'-diethyl-4,4'-diaminodiphenylmethane, and 171 parts by mass of propylene glycol monomethyl ether were put and were reacted with reflux for 2 hours. The resultant was concentrated at the reflux temperature over 3 hours to produce a modified maleimide compound (X-1) solution having a solid component concentration of 65% by mass. The weight average molecular weight (Mw) of the modified maleimide compound (X-1) obtained was about 2,700.

Examples 1 and 2, Comparative Examples 1 to 6

The components shown in Table 1 were stirred and mixed according to the formulation composition shown in Table 1 with 58 parts by mass of toluene and 10 parts by mass of methyl isobutyl ketone at a room temperature to prepare a resin composition having a solid component concentration of 55 to 65% by mass.

The resin composition obtained in each example was applied on a glass cloth having a thickness of 0.08 mm (E-glass, manufactured by Nitto Boseki Co., Ltd.), which was then dried with heat at 150° C. for 5 minutes to fabricate a prepreg having a content of a resin composition-derived solid component of about 47% by mass. A low profile copper foil having a thickness of 18 μm (BF-ANP18, Rz of M surface: 1.5 μm, manufactured by CIRCUIT FOIL) was placed on the upper and lower faces of the prepreg so that the M surface was in contact with the prepreg, and molding was performed with heat and pressure under conditions of a temperature of 230° C., a pressure of 3.0 MPa, and a time of 90 minutes to fabricate a double-side copper-clad laminate (thickness: 0.10 mm).

[Evaluation Method]

Using the double-side copper-clad laminate obtained in each example, evaluations were performed according to the following methods. The results are shown in Table 1.

(1. Dielectric Characteristics)

The dielectric constant and dielectric dissipation factor which are dielectric characteristics were measured as follows. The double-side copper-clad laminate was immersed in a copper etching solution (a 10 mass % solution of ammonium persulfate, manufactured by Mitsubishi Gas Chemical Company Inc.) to remove the outer layer copper foil thereof, and using a test piece of a length of 60 mm and a width of 2 mm cut out therefrom, measurement was performed by a cavity resonator perturbation method. Vector Network Analyzer "N5227A" manufactured by Agilent Technologies was used as a measurement apparatus, "CP129" (10 GHz band resonator) manufactured by KANTO Electronic Application and Development Inc. was used as a cavity resonator, and "CPMA-V2" was used as a measurement program. The measurement was performed under conditions of a frequency of 10 GHz and a measurement temperature of 25° C.

(2. Flame Retardancy)

The double-side copper-clad laminate was immersed in a copper etching solution (a 10 mass % solution of ammonium persulfate, manufactured by Mitsubishi Gas Chemical Company, Inc.) to remove the outer layer copper foil thereof, and a test piece having a length of 127 mm and a width of 12.7 mm was cut out. Next, according to a test method (V method) of UL94, a 20-mm flame was brought into contact with the lower end of the test piece, which was vertically kept, for 10 seconds two times to evaluate the flame retardancy according to the standard of the UL94 V method.

(3. Evaluation of Copper Foil Peeling Strength)

The copper foil peeling strength of the double-side copper-clad laminate was measured according to JIS C6481.

TABLE 1

|  |  |  | Example | | Comparative Example | | | | | |
|---|---|---|---|---|---|---|---|---|---|---|
|  |  |  | 1 | 2 | 1 | 2 | 3 | 4 | 5 | 6 |
| Formulation composition | Component (A): flame retardant | A-1 | 27 (1.72) | | | | | | | |
|  |  | A-2 | | 24 (1.72) | | | | | | |
|  | Component (A'): comparative flame retardant | A'-3 | | | 20 (1.72) | | | | | |
|  |  | A'-4 | | | | 15 (1.72) | | | | |
|  |  | A'-5 | | | | | 48 (1.72) | | | |
|  |  | A'-6 | | | | | | 22 (1.72) | | |
|  |  | A'-7 | | | | | | | 17 (1.72) | |
|  | Component (B): polyphenylene ether derivative | B-1 | 10 | 10 | 10 | 10 | 10 | 10 | 10 | 10 |
|  | Component (C): thermosetting resin | C-1 | 75 | 75 | 75 | 75 | 75 | 75 | 75 | 75 |
|  | Component (D): styrene-based thermoplastic elastomer | D-1 | 15 | 15 | 15 | 15 | 15 | 15 | 15 | 15 |
|  | Component (E): curing accelerator | E-1 | 0.5 | 0.5 | 0.5 | 0.5 | 0.5 | 0.5 | 0.5 | 0.5 |
|  |  | E-2 | 0.5 | 0.5 | 0.5 | 0.5 | 0.5 | 0.5 | 0.5 | 0.5 |
|  |  | E-3 | 0.5 | 0.5 | 0.5 | 0.5 | 0.5 | 0.5 | 0.5 | 0.5 |
|  | Component (F): inorganic filler | F-1 | 144 | 141 | 137 | 130 | 168 | 138 | 133 | 114 |
| Evaluation result | Dielectric constant Dk (10 GHz) |  | 4.0 | 4.1 | 4.3 | 4.0 | 3.9 | 4.1 | 4.1 | 4.0 |

TABLE 1-continued

|  | Example | | Comparative Example | | | | | |
|---|---|---|---|---|---|---|---|---|
|  | 1 | 2 | 1 | 2 | 3 | 4 | 5 | 6 |
| Dielectric dissipation factor Df (10 GHz) | 0.0064 | 0.0066 | 0.0076 | 0.0068 | 0.0064 | 0.0068 | 0.0067 | 0.0071 |
| Flame retardancy | V-0 | V-0 | V-1 | V-0 | V-1 | V-1 | V-0 | ND |
| Copper foil peeling strength (kN/m) | 0.5 | 0.5 | 0.4 | 0.5 | 0.4 | 0.4 | 0.4 | 0.6 |

(The unit for the formulation composition except for the numerical values in parentheses was parts by mass. The numerical values in parentheses in the flame retardant were each the content (unit: % by mass) of the flame retardant-derived phosphorus atom in the solid components in the resin composition except for an inorganic filler. "ND" in the table means "not-determined".)

The abbreviation or the like of each material in Table 1 is as follows.

[Component (A): Flame Retardant]

A-1: 4,4'-biphenol-bis(di-2,6-xylenyl phosphate) represented by the following formula (A-10), melting point: 184° C., average particle size: 1.5 μm.

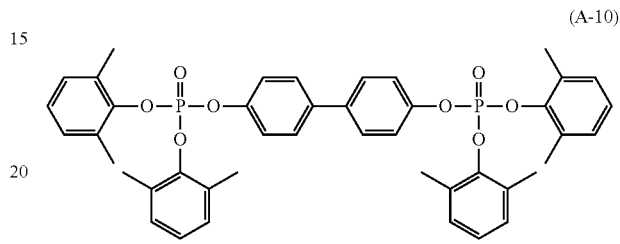

(A-10)

A-2: bisphenol A polyphenyl phosphate represented by the following formula (A-11).

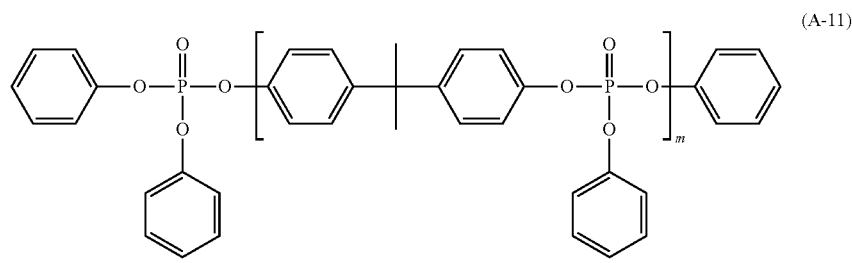

(A-11)

(m represents 1.1 to 1.2.)

[Component (A'): comparative flame retardant]

A'-3: phosphazene compound represented by the following formula (A-12).

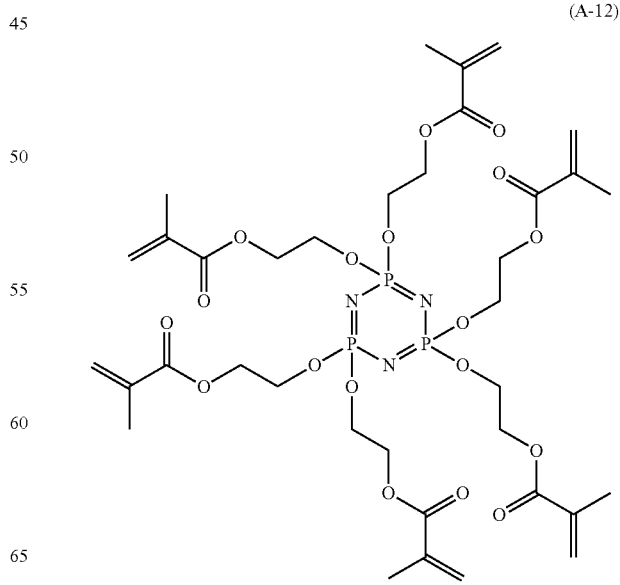

(A-12)

A'-4: phosphazene compound represented by the following formula (A-13).

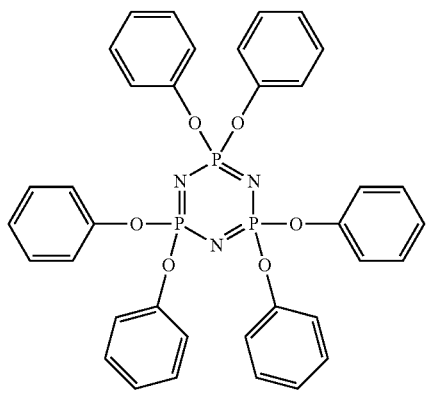

(A-13)

A'-5: phosphite compound represented by the following formula (A-14).

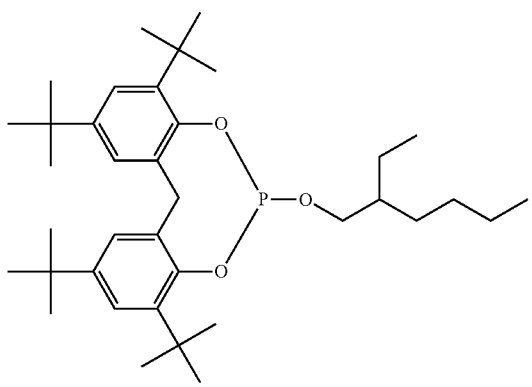

(A-14)

A'-6: phosphite compound represented by the following formula (A-15).

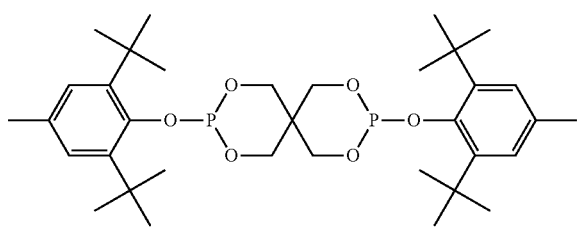

(A-15)

A'-7: p-xylylene diphenylphosphine oxide represented by the following formula (A-16).

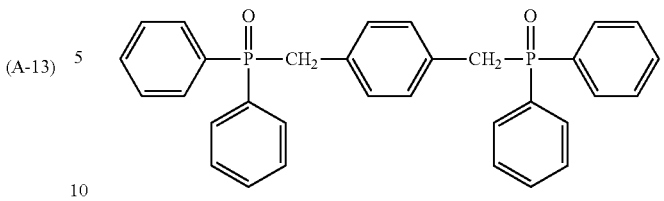

(A-16)

[Component (B): Polyphenylene Ether Derivative]
B-1: polyphenylene ether having a methacryloyl group at both ends (weight average molecular weight (Mw): 1700).

[Component (C): Thermosetting Resin]
C-1: the modified maleimide compound (X-1) prepared in Production Example 1.

[Component (D): Styrene-Based Thermoplastic Elastomer]
D-1: maleic anhydride-modified hydrogenated styrene-based thermoplastic elastomer (SEBS), acid value: 10 mg $CH_3ONa$/g, styrene content: 30%, MFR: 5.0 g/10 min (measurement condition for MFR: measured at 230° C. and a load of 2.16 kg according to ISO1133.).

[Component (E): Curing Accelerator]
E-1: product of addition reaction of p-benzoquinone to tri-n-butylphosphine
E-2: 2-undecylimidazole
E-3: dicyandiamide

[Component (F): Inorganic Filler]
Spherical fused silica: average particle size: 0.5 μm, 70 mass % slurry in methyl isobutyl ketone As is clear from the results shown in Table 1, the laminates of Examples 1 and 2 fabricated using the resin compositions of this embodiment have a lower dielectric dissipation factor than the laminates of Comparative Examples 1 to 6 and thus are excellent in high-frequency properties while having a sufficient flame retardancy and copper peeling strength. On the other hand, the laminates of Comparative Examples 1 to 5 in which a flame retardant other than the component (A) was used and the laminate of Comparative Example 6 in which no flame retardant was incorporated were poor in either dielectric dissipation factor or flame retardancy.

INDUSTRIAL APPLICABILITY

The resin composition of the present invention exhibits excellent dielectric characteristics in a high frequency band of 10 GHz or higher while having sufficient flame retardancy, and thus, a prepreg, a laminate, a multilayer printed wiring board, a semiconductor package, or the like obtained by using the resin composition are suitable for use in electronic parts that handle high frequency signals.

The invention claimed is:
1. A resin composition comprising:
a phosphate ester-based flame retardant (A) having an aromatic hydrocarbon group containing two or more aromatic ring structures, wherein the aromatic hydrocarbon group containing two or more aromatic ring structures is (a1) a divalent aromatic hydrocarbon group having two or more aromatic rings in which two of the two or more aromatic rings are linked via a single bond or a linking group having 5 or less carbon atoms or (a2) a divalent fused polycyclic aromatic hydrocarbon group containing two or more aromatic ring structures; and a polyphenylene ether derivative (B) having an ethylenically unsaturated bond-containing group at both ends.

2. The resin composition according to claim 1, wherein the component (A) is a compound represented by the following general formula (A-1):

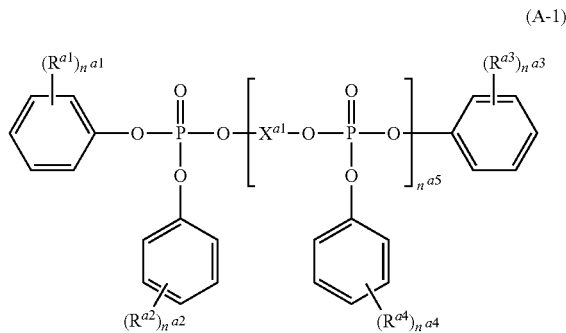

(A-1)

wherein $R^{a1}$ to $R^{a4}$ each independently represent an aliphatic hydrocarbon group having 1 to 5 carbon atoms or a halogen atom, $X^{a1}$ represents a divalent group represented by the following general formula (A-2) or a divalent fused polycyclic aromatic hydrocarbon group containing two or more aromatic ring structures, $n^{a1}$ to $n^{a4}$ each independently represent an integer of 0 to 5, and $n^{a5}$ represents an integer of 1 to 5:

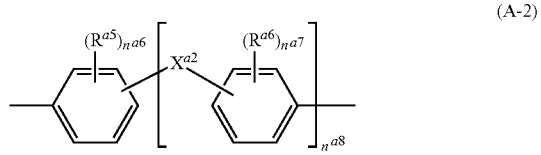

(A-2)

wherein $R^{a5}$ and $R^{a6}$ each independently represent an aliphatic hydrocarbon group having 1 to 5 carbon atoms or a halogen atom, $X^{a2}$ represents an alkylene group having 1 to 5 carbon atoms, an alkylidene group having 2 to 5 carbon atoms, an ether group, a sulfide group, a sulfonyl group, a carbonyloxy group, a keto group, or a single bond, $n^{a6}$ and $n^{a7}$ each independently represent an integer of 0 to 4, and $n^{a8}$ represents an integer of 1 to 3.

3. The resin composition according to claim 1, wherein the resin composition has a content of phosphorus atoms derived from the component (A) of 0.2 to 5% by mass based on solid components in the resin composition except for an inorganic filler.

4. The resin composition according to claim 1, wherein the ethylenically unsaturated bond-containing group of the component (B) is a (meth)acryloyl group.

5. The resin composition according to claim 1, wherein the component (B) has a weight average molecular weight (Mw) of 500 to 7,000.

6. The resin composition according to claim 1, further comprising at least one thermosetting resin (C) selected from the group consisting of an epoxy resin, a cyanate resin, and a maleimide compound.

7. The resin composition according to claim 6, wherein the resin composition comprises the maleimide compound as the component (C), the maleimide compound being a modified maleimide compound having a structural unit derived from a maleimide compound (c1) having at least two or more N-substituted maleimide groups and a structural unit derived from an amine compound (c2) having a primary amino group.

8. The resin composition according to claim 7, wherein the modified maleimide compound is a compound represented by the following general formula (C-2):

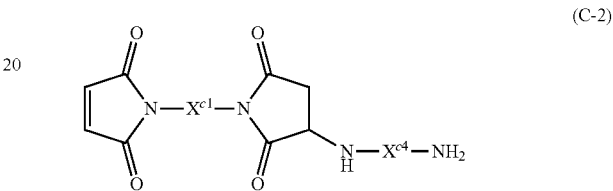

(C-2)

wherein $X^{c1}$ and $X^{c4}$ are each independently a divalent organic group.

9. The resin composition according to claim 1, further comprising one or more selected from the group consisting of a styrene-based thermoplastic elastomer (D), a curing accelerator (E), and an inorganic filler (F).

10. A prepreg comprising the resin composition according to claim 1 and a sheet-shaped fiber-reinforced substrate.

11. A laminate comprising the prepreg according to claim 10 and a metal foil.

12. A multilayer printed wiring board comprising the prepreg according to claim 10.

13. A semiconductor package comprising the multilayer printed wiring board according to claim 12 and a semiconductor device mounted on the multilayer printed wiring board.

14. A multilayer printed wiring board comprising the laminate according to claim 11.

15. A semiconductor package comprising the multilayer printed wiring board according to claim 14 and a semiconductor device mounted on the multilayer printed wiring board.

16. A method of producing a laminate, the method comprising a step of curing with heat the resin composition according to claim 1,
the component (A) having a melting point of 50 to 250° C.,
the curing with heat being performed at a temperature of the melting point of the component (A) or higher,
the component (A) in the resin composition before curing with heat having a particle shape.

* * * * *